(12) United States Patent
Sio et al.

(10) Patent No.: US 11,935,825 B2
(45) Date of Patent: Mar. 19, 2024

(54) CONTACT STRUCTURE, METHOD, LAYOUT, AND SYSTEM

(71) Applicant: TAIWAN SEMICONDUCTOR MANUFACTURING COMPANY, LTD., Hsinchu (TW)

(72) Inventors: Kam-Tou Sio, Zhubei (TW); Cheng-Chi Chuang, New Taipei (TW); Chih-Ming Lai, Hsinchu (TW); Jiann-Tyng Tzeng, Hsin Chu (TW); Wei-Cheng Lin, Taichung (TW); Lipen Yuan, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 13 days.

(21) Appl. No.: 16/554,035

(22) Filed: Aug. 28, 2019

(65) Prior Publication Data
US 2020/0105660 A1    Apr. 2, 2020

Related U.S. Application Data

(60) Provisional application No. 62/738,912, filed on Sep. 28, 2018.

(51) Int. Cl.
| | |
|---|---|
| *H01L 23/522* | (2006.01) |
| *G06F 30/394* | (2020.01) |
| *H01L 21/768* | (2006.01) |
| *H01L 21/8238* | (2006.01) |
| *H01L 23/528* | (2006.01) |
| *H01L 27/092* | (2006.01) |

(52) U.S. Cl.
CPC ........ *H01L 23/5221* (2013.01); *G06F 30/394* (2020.01); *H01L 21/76805* (2013.01); *H01L 21/76837* (2013.01); *H01L 21/76877* (2013.01); *H01L 21/823821* (2013.01); *H01L 21/823871* (2013.01); *H01L 23/5286* (2013.01); *H01L 27/0924* (2013.01)

(58) Field of Classification Search
CPC ..... H01L 21/823475; H01L 21/823821; H01L 21/76837; H01L 21/76805; H01L 29/41791; H01L 29/66795; H01L 29/785; H01L 21/76877; G06F 30/394
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2016/0284695 A1* | 9/2016 | Liaw | H01L 27/0886 |
| 2017/0117272 A1* | 4/2017 | Sio | H01L 23/528 |
| 2017/0278747 A1* | 9/2017 | Adusumilli | H01L 21/76897 |
| 2017/0323832 A1* | 11/2017 | Yang | H01L 27/0207 |
| 2020/0144400 A1* | 5/2020 | George | H01L 21/6835 |

* cited by examiner

Primary Examiner — Vongsavanh Sengdara
(74) Attorney, Agent, or Firm — Hauptman Ham, LLP

(57) ABSTRACT

An IC structure includes a fin structure, a contact overlying the fin structure along a first direction, and an isolation layer between the contact and the fin structure. The isolation layer is adjacent to a portion of the contact along a second direction perpendicular to the first direction.

20 Claims, 15 Drawing Sheets

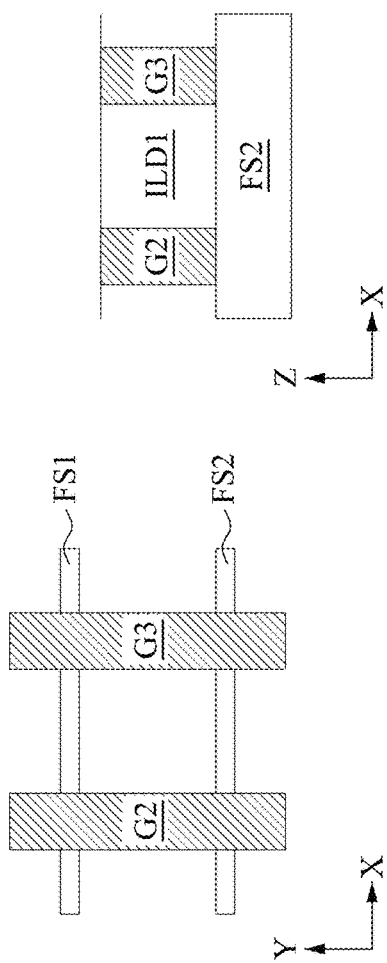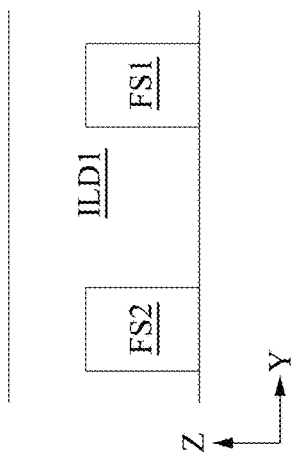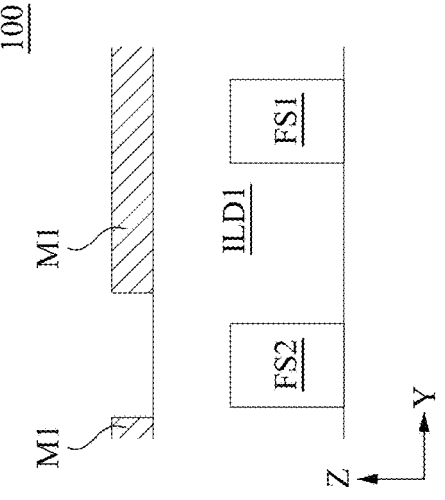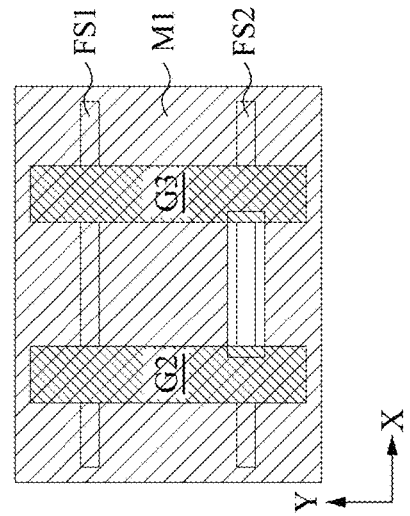
Fig. 3A
Fig. 3B

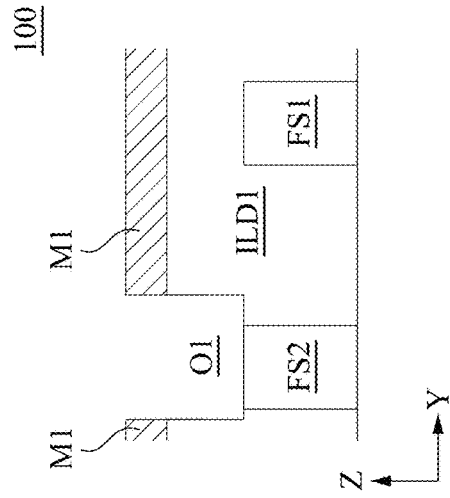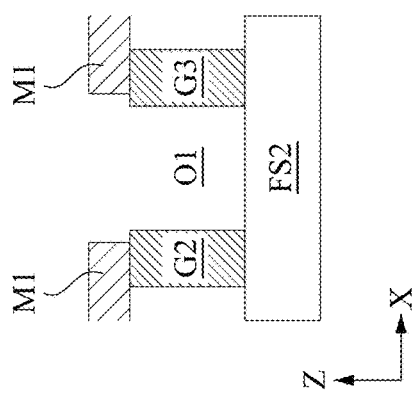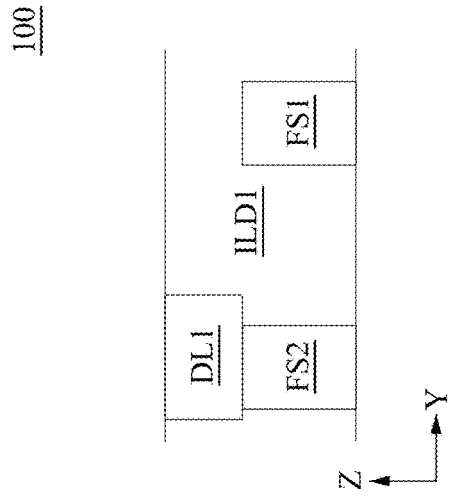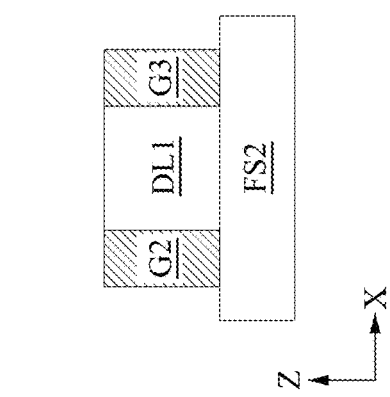
Fig. 3C
Fig. 3D
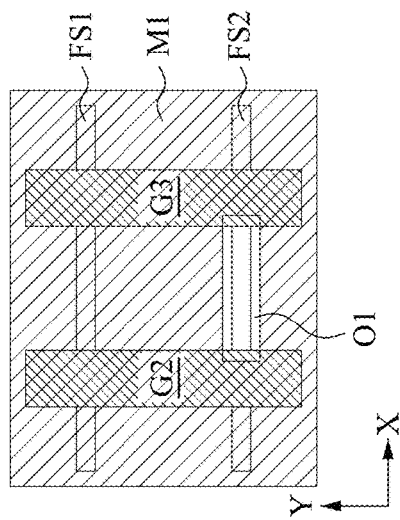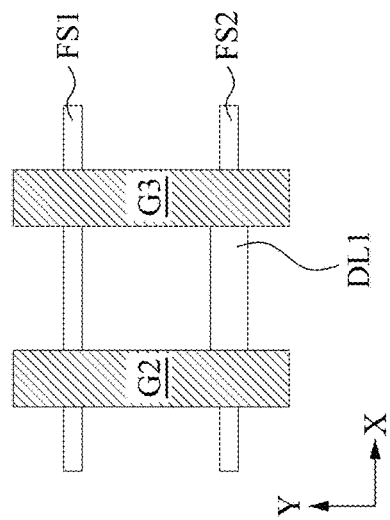

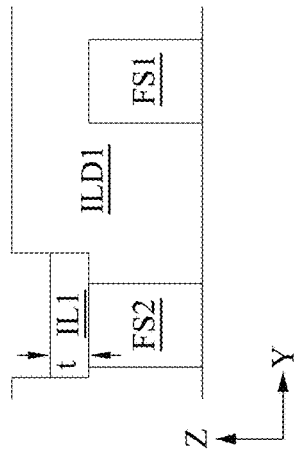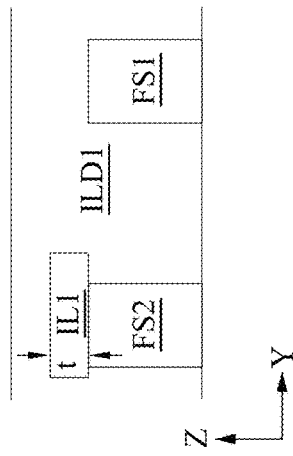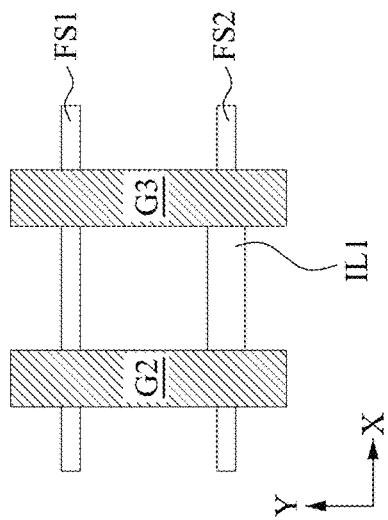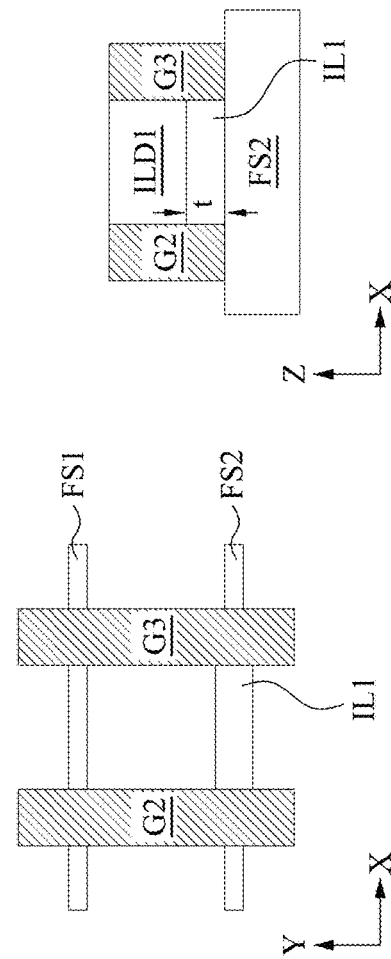
Fig. 3E
Fig. 3F

CONTACT STRUCTURE, METHOD, LAYOUT, AND SYSTEM

PRIORITY CLAIM

The present application claims the priority of U.S. Provisional Application No. 62/738,912, filed Sep. 28, 2018, which is incorporated herein by reference in its entirety.

BACKGROUND

An integrated circuit (IC) typically includes a number of IC devices represented in an IC layout diagram. An IC layout diagram is hierarchical and includes modules which carry out higher-level functions in accordance with the IC device's design specifications. The modules are often built from a combination of cells, each of which represents one or more IC structures configured to perform a specific logic or other function.

Cells typically have standard heights to facilitate placement into an IC layout diagram. To form the higher-level modules and enable external connections, cells and other IC features are routed to each other by interconnect structures formed in multiple overlying metal layers. Cell placement and interconnect routing are part of an overall design process for the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3K are diagrams of a contact structure at various manufacturing stages, in accordance with some embodiments.

DETAILED DESCRIPTION

Figure 1A:
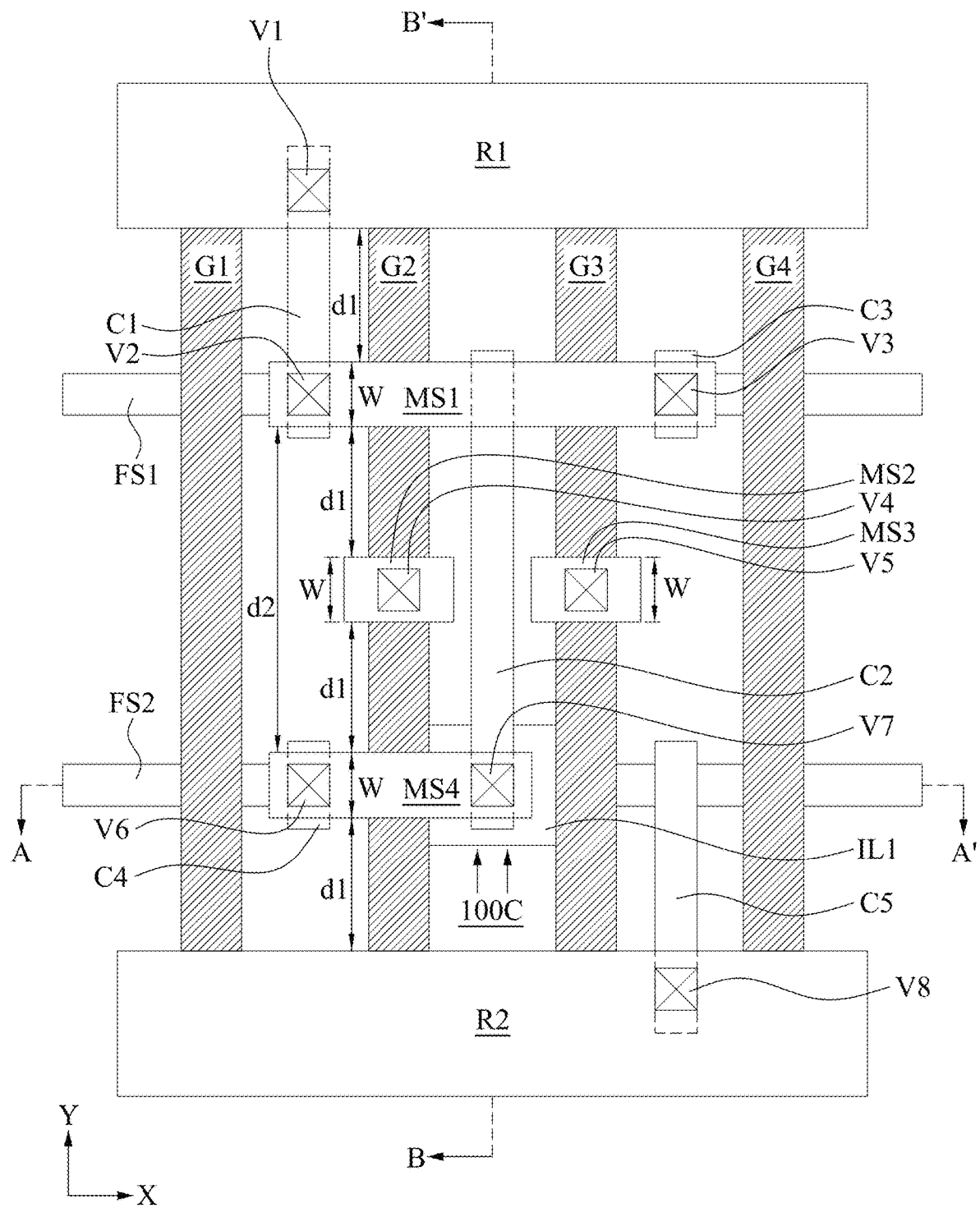
FIGS. 1A-1C are diagrams of an IC device including a contact structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a contact structure includes an isolation layer between a first fin structure and an overlying contact. By isolating the contact from the first fin structure, the contact is usable to form an electrical connection between a second fin structure and a via overlying the first fin structure. Compared to approaches in which a fin structure is not isolated from an overlying contact, the embodiments provide increased routing flexibility, thereby supporting IC layouts in which a separation between adjacent power rails corresponds to a total of three signal traces.

Figure 1B:
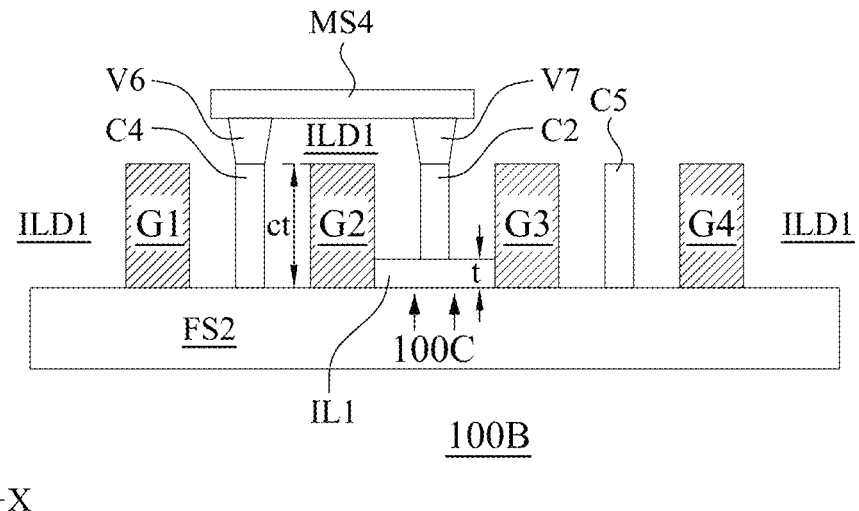
Figure 1C:
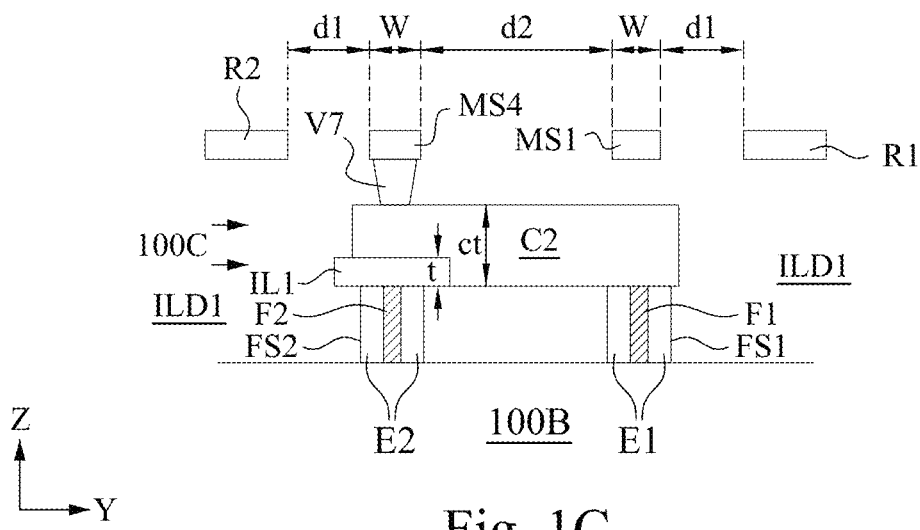

FIGS. 1A-1C are diagrams of an IC device 100 including a contact structure 100C, in accordance with some embodiments. In various embodiments, contact structure 100C, also referred to as an isolated contact structure or isolated fly contact structure in various embodiments, is formed by executing some or all of the operations of methods 200 and/or 400 and/or is configured based on an IC layout diagram 500, 600A, or 600B, discussed below with respect to FIGS. 2-6B. In some embodiments, contact structure 100C is included in an IC device 860 manufactured by an IC manufacturer/fabricator ("fab") 850, discussed below with respect to FIG. 8.

FIG. 1A depicts a plan view of IC device 100 including X and Y directions, an intersection with a plane A-A' along the X direction, and an intersection with a plane B-B' along the Y direction. FIG. 1B depicts a cross-sectional view of IC device 100 along plane A-A' including the X direction and a Z direction, and FIG. 1C depicts a cross-sectional view of IC device 100 along plane B-B' including the Y and Z directions.

IC device 100 includes fin structures FS1 and FS2 positioned in a substrate 100B, gate structures G1-G4 overlying fin structures FS1 and FS2, contacts C1-C5 overlying one or both of fin structures FS1 or FS2, an isolation layer IL1 overlying contact C2, vias V1-V8 overlying contacts C1-C5, metal segments MS1-MS4 overlying vias V2-V7, power rail R1 overlying via V1, power rail R2 overlying via V8, and an inter-level dielectric (ILD) structure ILD1 between and around the various structures discussed above. Contact structure 100C includes contact C2, isolation layer ILL a portion of fin structure FS1, and in some embodiments a portion of fin structure FS2, arranged within IC device 100, as discussed below.

The depictions of IC device 100 in FIGS. 1A-1C are a non-limiting example of IC device 100 including contact structure 100C. In various embodiments, IC device 100 includes one or more features (not shown), e.g., fin or gate structures, contacts, isolation layers, vias, metal segments, or power rails, in addition to or instead of, the features discussed above. In various embodiments, one or more of fin structures FS1 or FS2, gate structures G1-G4, contacts C1-C5, vias V1-V8, metal segments MS1-MS4, or power rails R1 or R2 is not included in IC device 100 or has a configuration other than that depicted in FIGS. 1A-1C and otherwise consistent with the arrangement of contact structure 100C discussed below.

The depictions of IC device 100 in FIGS. 1A-1C are simplified for the purpose of clarity. FIGS. 1A-1C depict views of IC device 100 with various features included, excluded, or having simplified shapes, and/or having simplified size, shape, and/or alignment relationships with other features, to facilitate the discussion below. In various embodiments, IC device 100 includes one or more metal interconnects, transistor elements, wells, isolation structures, or the like, in addition to the elements depicted in FIGS. 1A-1C.

Substrate 100B (FIGS. 1B and 1C) is a portion of a semiconductor wafer, e.g., a semiconductor wafer 853 discussed below with respect to FIG. 8, suitable for forming one or more IC devices. In various embodiments, substrate 100B includes n-type silicon (Si) including one or more donor dopants, e.g., phosphorous (P) or arsenic (As), or p-type silicon including one or more acceptor dopants, e.g., boron (B) or aluminum (Al).

Fin structures FS1 and FS2 are IC structures extending along the X direction (in the non-limiting example orientation depicted in FIGS. 1A-1C) that include one or more semiconductor materials and are usable as components of fin field-effect transistor (FinFET) devices. In various embodiments, one or both of fin structures FS1 or FS2 includes one or more of silicon, indium phosphide (InP), germanium (Ge), gallium arsenide (GaAs), silicon germanium (SiGe), indium arsenide (InAs), silicon carbide (SiC), or another suitable semiconductor material.

In some embodiments, one of fin structures FS1 or FS2 includes an n-type semiconductor material including one or more donor dopants and the other of fin structures FS1 or FS2 includes a p-type semiconductor material including one or more acceptor dopants, fin structures FS1 and FS2 thereby including separate types of semiconductor materials. In some embodiments, each of fin structures FS1 and FS2 includes a same n-type or p-type semiconductor material.

In some embodiments, each fin structure of fin structures FS1 and FS2 is formed in an active area (not shown) of substrate 100B, each active area including one or more dopants of the same type included in the corresponding fin structure. In some embodiments, an active area is electrically isolated from other elements in substrate 100B by one or more isolation structures (not shown), e.g., one or more shallow trench isolation (STI) structures.

In the embodiment depicted in FIGS. 1A-1C, fin structure FS1 includes a fin F1 and epitaxial layers E1 along each side of fin F1, and fin structure FS2 includes a fin F2 and epitaxial layers E2 along each side of fin F2. In various embodiments, each epitaxial layer E1 and E2 includes one or more semiconductor materials the same as, or different from, one or more semiconductor materials included in the corresponding fin F1 or F2. In various embodiments, each epitaxial layer E1 and E2 includes one or more dopants of the same type as one or more dopants included in the corresponding fin F1 or F2.

In the embodiment depicted in FIGS. 1A-1C, fin structure FS1 includes a single fin F1 and fin structure FS2 includes a single fin F2. In various embodiments, one or both of fin structures FS1 or FS2 includes one or more fins (not shown) in addition to corresponding fin F1 or F2, the one or more additional fins including a same type of semiconductor as the corresponding one of fins F1 or F2.

Gate structures G1-G4 are IC structures, each of which includes a volume (not shown) including one or more conductive materials substantially surrounded by one or more dielectric layers (not shown) including one or more dielectric materials configured to electrically isolate the one or more conductive materials from overlying, underlying, and adjacent structures, e.g., fin structures FS1 and FS2. Each gate structure G1-G4 is thereby configured to control an electric field strength applied to the underlying and adjacent structure.

Conductive materials include one or more of polysilicon, copper (Cu), tungsten (W), cobalt (Co), ruthenium (Ru), or one or more other metals, and/or one or more other suitable materials. Dielectric materials include one or more of silicon nitride ($Si_3N_4$), silicon dioxide ($SiO_2$), aluminum oxide ($Al_2O_3$), hafnium oxide ($HfO_2$), tantalum pentoxide ($Ta_2O_5$), titanium oxide ($TiO_2$), or another suitable material.

Contacts C1-C5, vias V1-V8, metal segments MS1-MS4, and power rails R1 and R2 are IC structures including one or more conductive materials configured to electrically connect one or more underlying, overlying, and/or adjacent IC structures to one or more additional underlying, overlying, and/or adjacent IC structures. Contacts C1-C5 are configured to electrically connect underlying fin structures FS1 and FS2 to overlying vias V1-V8, and vias V1-V8 are configured to electrically connect underlying contacts C1-C5 and gate structures G1-G4 to overlying metal segments MS1-MS4 and power rails R1 and R2.

As depicted in FIGS. 1B and 1C, contacts C1-C5 have a thickness ct in the Z direction. Thickness ct corresponds to a distance between an upper surface (not labeled) of an underlying fin structure and an overlying via such that each contact C1-C5 is capable of forming an electrical connection between a underlying fin structure and an overlying via. In some embodiments, thickness ct has a value that ranges from 10 nanometers (nm) to 700 nm. In some embodiments, thickness ct has a value that ranges from 20 nm to 100 nm.

Metal segments MS1-MS4 and power rails R1 and R2 are portions of a same metal layer of a manufacturing process used to construct IC device 100 and are configured to electrically connect vias V1-V8 to one or more overlying and/or adjacent IC structures (not shown). In various embodiments, metal segments MS1-MS4 and power rails R1 and R2 are portions of a first metal layer, e.g., a metal zero or metal one layer of the manufacturing process.

Isolation layer IL1 is one or more dielectric layers including one or more dielectric materials configured to electrically isolate underlying fin structure FS2 from overlying and adjacent contact C2.

ILD structure ILD1 is one or more dielectric layers including one or more dielectric materials configured to provide electrical isolation and mechanical support to fin structures FS1 and FS2, gate structures G1-G4, contacts C1-C5, vias V1-V8, metal segments MS1-MS4, power rails R1 and R2, and, if present, other features of IC device 100.

ILD structure ILD1 includes at least one dielectric material different from at least one dielectric material included in isolation layer IL1.

In various embodiments, ILD structure ILD1 includes a continuous volume of the one or more dielectric materials, or a plurality of separate volumes of the one or more dielectric materials.

Power rail R1 is configured to electrically connect IC device 100 to a first voltage source (not shown) and is thereby configured to carry a first voltage. Power rail R2 is configured to electrically connect IC device 100 to a second voltage source (not shown) and is thereby configured to carry a second voltage. In some embodiments, the first voltage source is a power supply, power rail R1 is thereby configured to carry a power supply voltage, the second voltage source is a reference voltage node, e.g., a ground, and power rail R2 is thereby configured to carry a reference, e.g., ground voltage. In some embodiments, the second voltage source is the power supply, power rail R2 is thereby configured to carry the power supply voltage, the first voltage source is the reference voltage node, and power rail R1 is thereby configured to carry the reference, e.g., ground voltage.

In the embodiment depicted in FIGS. 1A-1C, power rail R1 is electrically connected to via V1, and is thereby electrically connected to contact C1, to fin structure FS1 and via V2 between gate structures G1 and G2, to metal segment MS1, to via V3, to contact C3, and to fin structure FS1 between gate structures G3 and G4. Power rail R2 is electrically connected to via V8, and is thereby electrically connected to contact C5, and to fin structure FS2 between gate structures G3 and G4.

Metal segment MS2 is electrically connected to via V4, and is thereby electrically connected to gate structure G2. Metal segment MS3 is electrically connected to via V5, and is thereby electrically connected to gate structure G3. Metal segment MS4 is electrically connected to via V6, and is thereby electrically connected to contact C4 and to fin structure FS2 between gate structures G1 and G2. Metal segment MS4 is also electrically connected to via V7, and is thereby electrically connected to contact C2 and to fin structure FS1 between gate structures G2 and G3.

Isolation layer IL1 is positioned between contact C2 and fin structure FS2 along the Z direction and is thereby configured to electrically isolate contact C2 from fin structure FS2 such that metal segment MS4, via V7, and contact C2 are not electrically connected to fin structure FS2 between gate structures G2 and G3.

As depicted in FIGS. 1B and 1C, isolation layer IL1 has a thickness t in the Z direction. Thickness t corresponds to a distance between an upper surface (not labeled) of underlying fin structure FS2 and overlying contact C2, and thereby to a reduction in a thickness of a portion of contact C2 between isolation layer IL1 and via V7 from the contact C1-C5 thickness ct to a value ct–t. Accordingly, thickness t has a value sufficiently large such that isolation layer IL1 electrically isolates fin structure FS2 from contact C2 and sufficiently small such that contact C2 provides a low resistance path between via V7 and fin structure FS1.

In accordance with the reduction in the thickness of the portion of contact C2, isolation layer IL1 is adjacent to another portion of contact C2 along the Y direction, as depicted in FIG. 1C.

Isolation layer IL1 is considered to electrically isolate fin structure FS2 from contact C2 by having a minimum resistance value corresponding to one or more design specifications associated with IC device 100. The resistance value of isolation layer IL1 is a function of one or more resistivity values of the one or more dielectric materials included in isolation layer ILL the dimensions of isolation layer IL1 in the X and Y directions, and thickness t in the Z direction.

Contact C2 is considered to form a low resistance path between via V7 and fin structure FS1 by having a maximum path resistance value corresponding to one or more design specifications associated with IC device 100. The path resistance value of contact C2 is a function of one or more resistivity values of the one or more conductive materials included in contact C2, thickness t in the Z direction, the overall dimensions of contact C2 in the X, Y, and Z directions, and the reduced thickness ct–t of the portion of contact C2 between isolation layer IL1 and via V7.

Accordingly, both the sufficiently large value of thickness t corresponding to isolation layer IL1 electrically isolating fin structure FS2 from contact C2 and the sufficiently small value of thickness t corresponding to contact C2 providing the low resistance path between via V7 and fin structure FS1 vary with the specific embodiment of IC device 100. In some embodiments, thickness t has a value that ranges from 5 nm to 50 nm. In some embodiments, thickness t has a value that ranges from 10 nm to 20 nm.

In the embodiment depicted in FIGS. 1A-1C, isolation layer IL1 contacts each of gate structures G2 and G3 and thereby extends from gate structure G2 to gate structure G3. In various embodiments, isolation layer IL1 does not contact one or both of gate structures G2 or G3, and thereby does not extend from gate structure G2 to gate structure G3.

As depicted in FIGS. 1A-1C, various portions of ILD structure ILD1 overlie, underlie, and/or are adjacent to various portions of each of contact C2, isolation layer ILL and fin structure FS2, each of contact C2, isolation layer ILL and fin structure FS2 thereby contacting ILD structure ILD1. ILD structure ILD1 is thereby configured to further isolate contact C2 from fin structure FS2 such that metal segment MS4, via V7, and contact C2 are not electrically connected to fin structure FS2 between gate structures G2 and G3.

In the embodiment depicted in FIGS. 1A-1C, contact structure 100C includes contact C2, isolation layer ILL the portion of fin structure FS1 underlying contact C2, and the portion of fin structure FS2 underlying contact C2. In some embodiments, contact structure 100C includes one or more portions of ILD structure ILD1 configured to isolate contact C2 from fin structure FS2.

As depicted in FIGS. 1A and 1C, contact structure 100C is configured to electrically isolate contact C2 from fin structure FS2 by including isolation layer IL1 extending beyond fin structure FS2 in the positive and negative Y directions, and an edge of contact C2 aligning in the Z direction with the portion of isolation layer IL1 that extends beyond fin structure FS2 in the negative Y direction. In various embodiments, contact structure 100C includes isolation layer IL1 and contact C2 otherwise configured to electrically isolate contact C2 from fin structure FS2, e.g., by including isolation layer IL1 extending beyond fin structure FS2 in only the positive Y direction and the edge of contact C2 modified accordingly, or by including contact C2 extending beyond isolation layer IL1 in the negative Y direction.

As depicted in FIGS. 1A and 1B, contact structure 100C includes contact C2 having a width (not labeled) in the X direction less than a width (not labeled) of isolation layer IL1 in the X direction such that contact C2 does not extend from gate structure G2 to gate structure G3. In some embodiments, contact C2 and isolation layer IL1 have a same width in the X direction. In some embodiments, contact C2 extends from gate structure G2 to gate structure G3.

By isolating contact C2 from fin structure FS2, contact structure 100C including contact C2 is usable to form an electrical connection between via V7 overlying fin structure FS2 and fin structure FS1. Compared to approaches in which a fin structure is not isolated from an overlying contact, contact structure 100C enables a first fin location to be electrically routed through a connection at a location other than the first fin location, e.g., a second fin location, thereby providing increased routing flexibility.

In some embodiments, contact structure 100C does not include the portion of fin structure FS1 underlying contact C2, and contact C2 is otherwise configured so as to be usable to form an electrical connection between via V7 overlying fin structure FS2 and a feature (not shown) other than fin structure FS1. In various embodiments, contact C2 is configured to be electrically connected to a fin structure (not shown) other than fin structure FS1 or to one or more vias (not shown) other than vias V1-V8. In various embodiments, the one or more additional vias are configured to be electrically connected to one or more metal segments (not shown) other than metal segments MS1-MS4, and/or to one of power rails R1 or R2 or to a power rail (not shown) other than power rail R1 or R2.

In various embodiments, contact C2 is configured to be electrically connected to one or more additional fin structures and/or vias by underlying one or more power rails, e.g., one or both of power rails R1 or R2. In various embodiments, contact C2 is configured to be electrically connected to one or more additional fin structures and/or vias by extending beyond one or both of power rails R1 or R2.

In the various embodiments, by isolating contact C2 from fin structure FS2 such that contact C2 is usable to form an electrical connection between via V7 overlying fin structure FS2 and one or more other features as discussed above, contact structure 100C provides increased routing flexibility compared to approaches in which a fin structure is not isolated from an overlying contact.

In the embodiment depicted in FIGS. 1A-1C, metal segments MS1-MS4 are positioned between power rails R1 and R2, and each of metal segments MS1-MS4 has approximately a same width w in the Y direction. Widths w are considered to be approximately equal to a width value or to be approximately the same by being within a range corresponding to a nominal width value plus or minus a manufacturing tolerance for the metal layer in which metal segments MS1-MS4 are positioned. In some embodiments, the nominal width value is a minimum width value of the metal layer in which metal segments MS1-MS4 are positioned. In some embodiments, width w has the nominal width value ranging from 8 nm to 800 nm.

A separation between metal segment MS1 and power rail R1 is approximately equal to a distance d1 in the Y direction, a separation between metal segment MS1 and each of metal segments MS2 and MS3 is approximately equal to distance d1, a separation between each of metal segments MS2 and MS3 and metal segment MS4 is approximately equal to distance d1, and a separation between metal segment MS4 and power rail R2 is approximately equal to distance d1. Thus, the separation between metal segment MS1 and power rail R1 and the separation between metal segment MS4 and power rail R2 have the approximately same distance d1.

Separations are considered to be approximately equal to a distance value or to have approximately the same distance value by being within a range corresponding to a nominal separation, or space, value plus or minus a manufacturing tolerance for the metal layer in which metal segments MS1-MS4 and power rails R1 and R2 are positioned. In some embodiments, the nominal separation value is a minimum space value of the metal layer in which metal segments MS1-MS4 and power rails R1 and R2 are positioned. In some embodiments, distance d1 has the nominal separation value ranging from 8 nm to 800 nm.

In some embodiments, the nominal width value corresponding to width w and the nominal separation value corresponding to distance d1 are based on a pitch of a plurality of tracks in an IC layout diagram corresponding to IC device 100, e.g., pitch P1 of tracks T1-T5 of IC layout diagram 500 discussed below with respect to FIG. 5.

Based on each of metal segments MS2 and MS3 having approximately the same width w, the separation between metal segment MS1 and each of metal segments MS2 and MS3 being approximately equal to distance d1, and the separation between each of metal segments MS2 and MS3 and metal segment MS4 being approximately equal to distance d1, a separation between metal segments MS1 and MS4 is approximately equal to a distance $d2=w+2d1$. Accordingly, a separation between power rails R1 and R2 is approximately equal to $d2+2w+2d1=3w+4d1$.

By the configuration discussed above, IC device 100 includes power rails R1 and R2 separated by a distance corresponding to a total of three metal segment widths, the metal segments being referred to as signal traces in some embodiments, and four metal spaces. An IC device, e.g., IC device 100, that includes contact structure 100C having increased routing flexibility compared to approaches in which a fin structure is not isolated from an overlying contact, thereby supports IC layouts in which a separation between adjacent power rails corresponds to a total of three signal traces and four metal spaces.

The features and configurations of IC device 100 other than contact structure 100C depicted in FIGS. 1A-1C are a non-limiting example presented for the purpose of illustration. In various embodiments, IC devices including contact structure 100C are otherwise configured to include two or more power rails separated by a distance corresponding to a total of three metal segment widths and four metal spaces.

In various embodiments, compared to approaches in which a fin structure is not isolated from an overlying contact, an IC device, e.g., IC device 100, includes contact structure 100C having increased routing flexibility based on configurations in which power rails are separated by distances corresponding to totals of more than three metal segment widths and four metal spaces.

Figure 2:
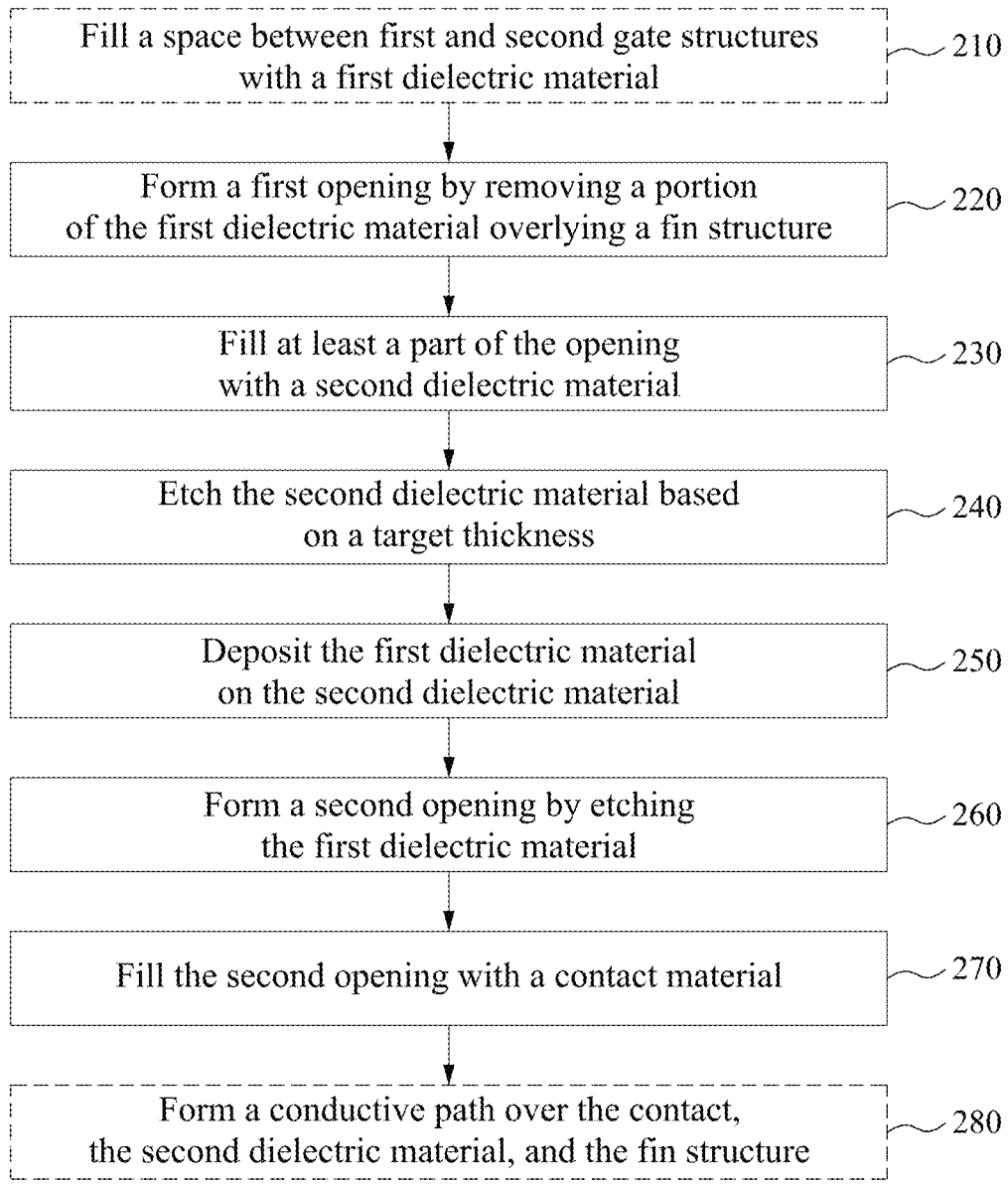
FIG. 2 is a flowchart of a method of manufacturing a contact structure, in accordance with some embodiments.

FIG. 2 is a flowchart of a method 200 of forming a contact structure, e.g., contact structure 100C discussed above with respect to FIGS. 1A-1C, in accordance with some embodiments. FIGS. 3A-3K are diagrams of a portion of IC device 100 including contact structure 100C at various manufacturing stages corresponding to the operations of method 200, in accordance with some embodiments. Each of FIGS. 3A-3K includes first, second, and third diagrams from left to right that correspond to the plan and cross-sectional views of IC device 100 depicted in FIGS. 1A-1C. To facilitate the illustration of the various features, the plan views depicted in FIGS. 3A-3K do not include ILD layers, e.g., ILD structure ILD1 discussed above with respect to FIGS. 1A-1C, and the cross-sectional views include only relevant portions of ILD structure ILD1.

The sequence in which the operations of method 200 are depicted in FIG. 2 is for illustration only; the operations of method 200 are capable of being executed simultaneously or in sequences that differ from that depicted in FIG. 2. In some embodiments, operations in addition to those depicted in FIG. 2 are performed before, between, during, and/or after the operations depicted in FIG. 2.

At operation 210, in some embodiments, a space between first and second gate structures is filled with a first dielectric material. In some embodiments, filling the space with the first dielectric material corresponds to forming a portion of ILD structure ILD1 between gate structures G2 and G3 discussed above with respect to FIGS. 1A-1C, and depicted in FIG. 3A. In some embodiments, filling the space with the first dielectric material includes filling the space with the one or more dielectric materials included in ILD structure ILD1.

In some embodiments, filling the space includes using a deposition process. In various embodiments, a deposition process includes a chemical vapor deposition (CVD), a plasma enhanced CVD (PECVD), or other process suitable for depositing one or more material layers.

In some embodiments, filling the space includes performing a planarization process. In various embodiments, a planarization process includes a chemical-mechanical polishing (CMP) or other process suitable for producing a planarized top surface at a given manufacturing stage.

At operation 220, a first opening between first and second gate structures is formed by removing a portion of the first dielectric material overlying a fin structure. In some embodiments, forming the first opening corresponds to removing a portion of ILD structure ILD1 between gate structures G2 and G3 and overlying fin structure FS2 discussed above with respect to FIGS. 1A-1C. In some embodiments, forming the first opening includes applying a mask and forming the first opening by removing a portion of the first dielectric material exposed by the mask. In some embodiments, forming the first opening corresponds to applying mask M1 depicted in FIGS. 3B and 3C, and forming opening O1 depicted in FIG. 3C by removing the portion of ILD structure ILD1 exposed by mask M1.

In some embodiments, removing the portion of the first dielectric material overlying the fin structure includes using an etching operation. In various embodiments, using an etching operation includes using one or more etch processes such as a wet etch, a dry etch, a sputtering etch or other suitable removal process. In various embodiments, using an etching operation includes using one or more etchant materials, e.g., one or more of $Cl_2$, $SF_6$, HBr, HCl, $CF_4$, $CHF_3$, $C_2F_6$, $C_4F_8$, or other suitable etchant materials.

In various embodiments, removing the portion of the first dielectric material overlying the fin structure includes exposing one or both of the gate structures and/or the fin structure, e.g., gate structures G2 and/or G3 and/or fin structure FS2, as depicted in FIG. 3C.

In some embodiments, removing the portion of the first dielectric material overlying the fin structure includes removing the mask, e.g., mask M1.

At operation 230, at least a part of the first opening is filled with a second dielectric material. Filling the at least part of the first opening with the second dielectric material includes filling the at least part of the first opening with the second dielectric material different from the first dielectric material. In some embodiments, filling the at least part of the first opening corresponds to at least part of forming isolation layer IL1 discussed above with respect to FIGS. 1A-1C, by filling at least part of opening O1 with a dielectric layer DL1 depicted in FIG. 3D.

In some embodiments, filling the at least part of the first opening with the second dielectric material includes filling the at least part of the first opening with the one or more dielectric materials included in isolation layer IL1.

In various embodiments, filling the at least part of the first opening with the second dielectric material includes filling a portion of the first opening, all of the first opening up to a top surface (not labeled) surrounding the first opening, or all of the first opening plus a volume (not shown) above the top surface surrounding the first opening. In some embodiments, filling the portion of the first opening includes filling the portion to a target thickness corresponding to thickness t of isolation layer IL1 discussed above with respect to FIGS. 1A-1C.

In some embodiments, filling the at least part of the first opening includes using a deposition process. In some embodiments, filling the at least part of the first opening includes using a planarization process.

In some embodiments, filling the at least part of the first opening includes forming the second dielectric material extending from the first gate structure to the second gate structure, e.g., gate structures G2 and G3 as depicted in FIG. 3D. In some embodiments, filling the at least part of the first opening includes forming the second dielectric material directly on the fin structure, e.g., fin structure FS2 as depicted in FIG. 3D.

At operation 240, in some embodiments, the second dielectric material is etched based on a target thickness, e.g., thickness t of isolation layer IL1 discussed above with respect to FIGS. 1A-1C. In some embodiments, etching the second dielectric material includes using an etching process in which the second dielectric material is selectively etched compared to the first dielectric material. In some embodiments, etching the second dielectric material includes removing a portion of dielectric layer DL1 to form isolation layer IL1 having thickness t as depicted in FIGS. 3D and 3E.

At operation 250, in some embodiments, the first dielectric material is deposited on the second dielectric material. In some embodiments, depositing the first dielectric material on the second dielectric material includes forming a portion of ILD structure ILD1 overlying isolation layer IL1 discussed above with respect to FIGS. 1A-1C as depicted in FIG. 3F.

In some embodiments, depositing the first dielectric material on the second dielectric material includes using a deposition process. In some embodiments, depositing the first dielectric material on the second dielectric material includes using a planarization process.

At operation 260, a second opening is formed by etching the first dielectric material. In some embodiments, forming the second opening includes applying a mask and forming the second opening by removing a portion of the first dielectric material exposed by the mask. In some embodiments, forming the second opening corresponds to applying mask M2 depicted in FIGS. 3G and 3H, and forming opening O2 depicted in FIG. 3H by removing the portion of ILD structure ILD1 exposed by mask M2.

Figure 3G:
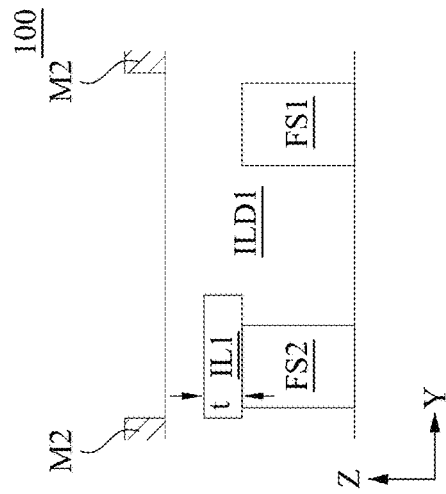
Figure 3G:
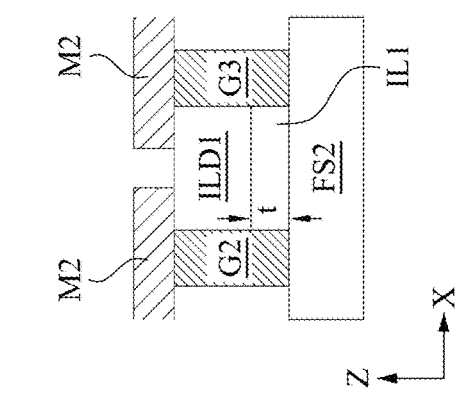
Figure 3G:
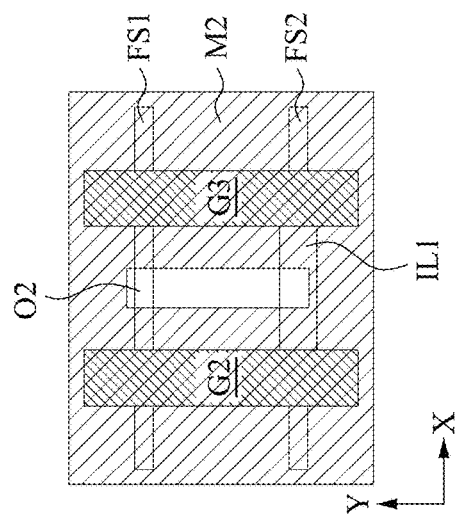
Figure 3H:
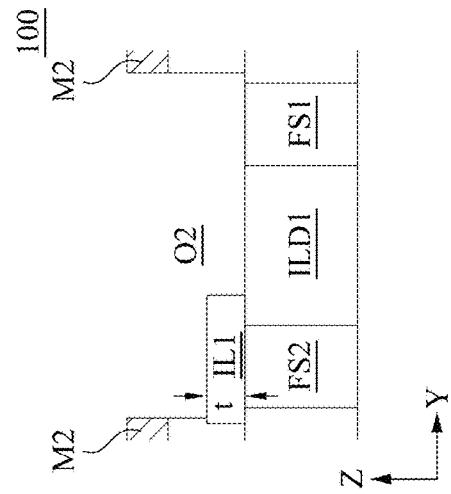
Figure 3H:
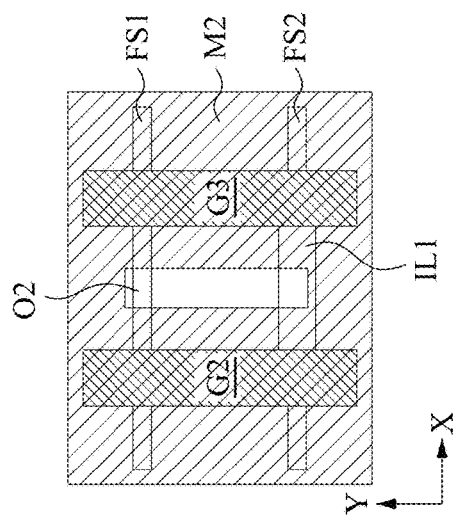

In the embodiment depicted in FIGS. 3G and 3H, mask M2 extends continuously around a single region corresponding to opening O2 such that each dimension of opening O2 is defined by mask M2. In various embodiments, mask M2 includes one or more discrete components and does not extend continuously around a single region such that one or more dimensions of opening O2 are defined by a feature other than mask M2, e.g., by being aligned with one or both of gate structures G2 or G3. In some embodiments, the mask, e.g., mask M2, is referred to as a not-contact mask.

In some embodiments, etching the first dielectric material includes using an etching process in which the first dielectric material is selectively etched compared to the second dielectric material. In various embodiments, etching the first dielectric material includes exposing one or both of the second dielectric material or a second fin structure. In some embodiments, etching the first dielectric material includes exposing one or both of isolation layer IL1 or fin structure FS1 discussed above with respect to FIGS. 1A-1C, as depicted in FIG. 3H.

Figure 3I:
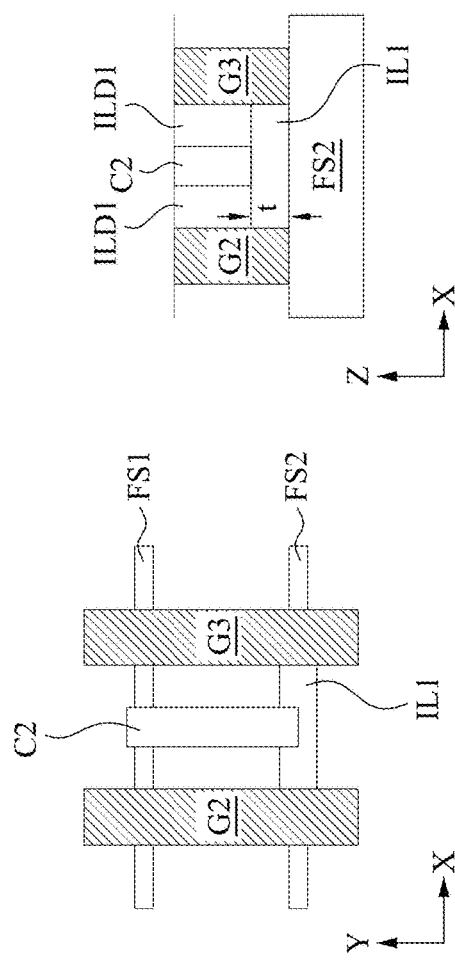
Figure 3I:
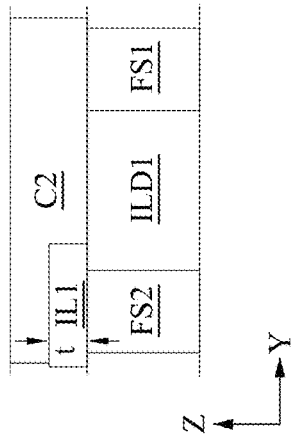

At operation 270, a contact is formed overlying the fin structure and the second dielectric material by filling the second opening with a contact material. Forming the contact includes forming the contact electrically isolated from the fin structure at least in part by the second dielectric material. In some embodiments, forming the contact includes forming contact C2 overlying fin structure FS2 and isolation layer ILL and electrically isolated from fin structure FS2 by isolation layer ILL discussed above with respect to FIGS. 1A-1C, as depicted in FIG. 3I.

In some embodiments, forming the contact includes forming the contact electrically isolated from the fin structure in part by the first dielectric material. In some embodiments, forming the contact includes forming contact C2 electrically isolated from fin structure FS2 in part by ILD structure ILD1 discussed above with respect to FIGS. 1A-1C, as depicted in FIG. 3I.

In some embodiments, forming the contact includes forming the contact overlying the second fin structure, thereby forming an electrical connection between the second fin structure and the contact. In some embodiments, forming the contact includes forming contact C2 overlying fin structure FS1 discussed above with respect to FIGS. 1A-1C, thereby forming an electrical connection between fin structure FS1 and contact C2, as depicted in FIG. 3I.

In some embodiments, forming the contact is part of forming a plurality of contacts. In some embodiments, forming the plurality of contacts includes forming at least one contact electrically connected to the fin structure. In some embodiments, forming the plurality of contacts includes forming at least one of contacts C4 or C5 electrically connected to fin structure FS2 discussed above with respect to FIGS. 1A-1C.

In some embodiments, forming the contact is considered to include both of operations 260 and 270.

Figure 3J:
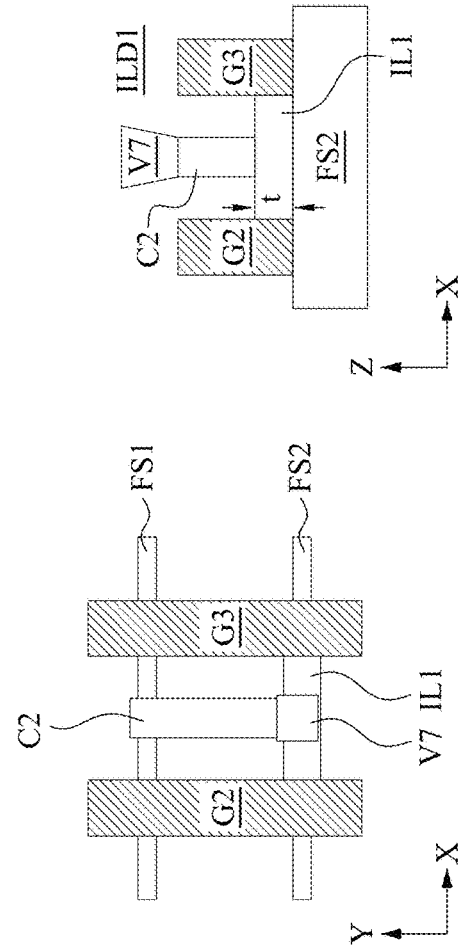
Figure 3J:
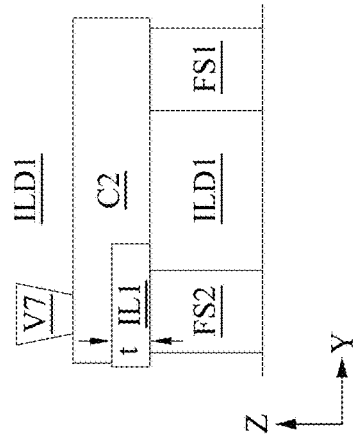

At operation 280, in some embodiments, a conductive path is formed over the contact, the second dielectric material, and the fin structure. Forming the conductive path includes forming a via overlying the contact, the second dielectric material, and the fin structure, thereby forming an electrical connection between the contact and the via. In some embodiments, forming the via includes forming via V7 discussed above with respect to FIGS. 1A-1C, as depicted in FIG. 3J.

In some embodiments, forming the conductive path includes forming one or more portions of the ILD structure including the first dielectric material, e.g., ILD structure ILD1 discussed above with respect to FIGS. 1A-1C.

Figure 3K:
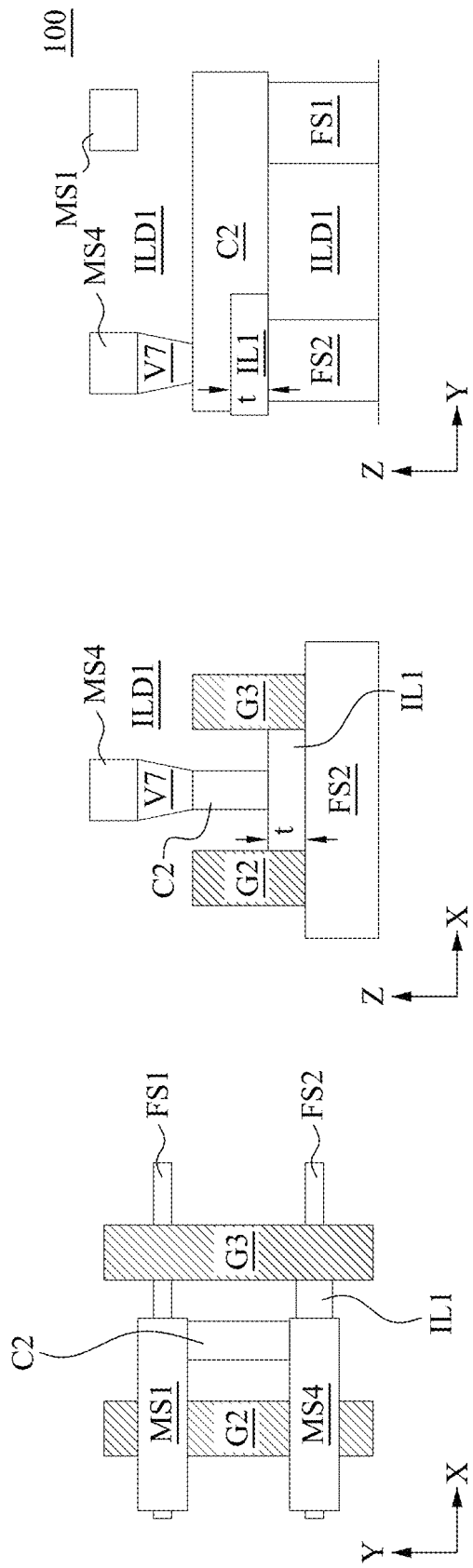

In some embodiments, forming the conductive path includes forming a first metal segment overlying the via, thereby forming an electrical connection between the via and the metal segment. In some embodiments, forming the first metal segment includes forming metal segment MS4 discussed above with respect to FIGS. 1A-1C, as depicted in FIG. 3K.

In some embodiments, forming the conductive path includes forming a second metal segment on the first dielectric material and overlying the contact and the second fin structure, thereby electrically isolating the contact from the second metal segment. Forming the first and second metal segments are part of forming a same metal layer. In some embodiments, forming the second metal segment includes forming metal segment MS1 discussed above with respect to FIGS. 1A-1C, as depicted in FIG. 3K.

In some embodiment, forming the first and second metal segments includes forming first and second power rails, e.g., power rails R1 and R2 discussed above with respect to FIGS. 1A-1C, as part of forming the same metal layer. In some embodiments, forming the first and second metal segments and first and second power rails includes forming each of the first and second metal segments having a same width, separating the first and second metal segments from the corresponding first and second power rails by a same space, and separating the first and second power rails by a distance corresponding to a total of three times the width plus four times the space.

The operations of method 200 are usable to form an IC device including a contact structure, e.g., IC device 100 including contact structure 100C discussed above with respect to FIGS. 1A-1C, by forming an isolation layer between a fin structure and an overlying contact. Compared to methods that do not include forming the isolation layer, method 200 is usable to form contact structures with improved routing flexibility as discussed above with respect to IC device 100 and contact structure 100C.

Figure 4:
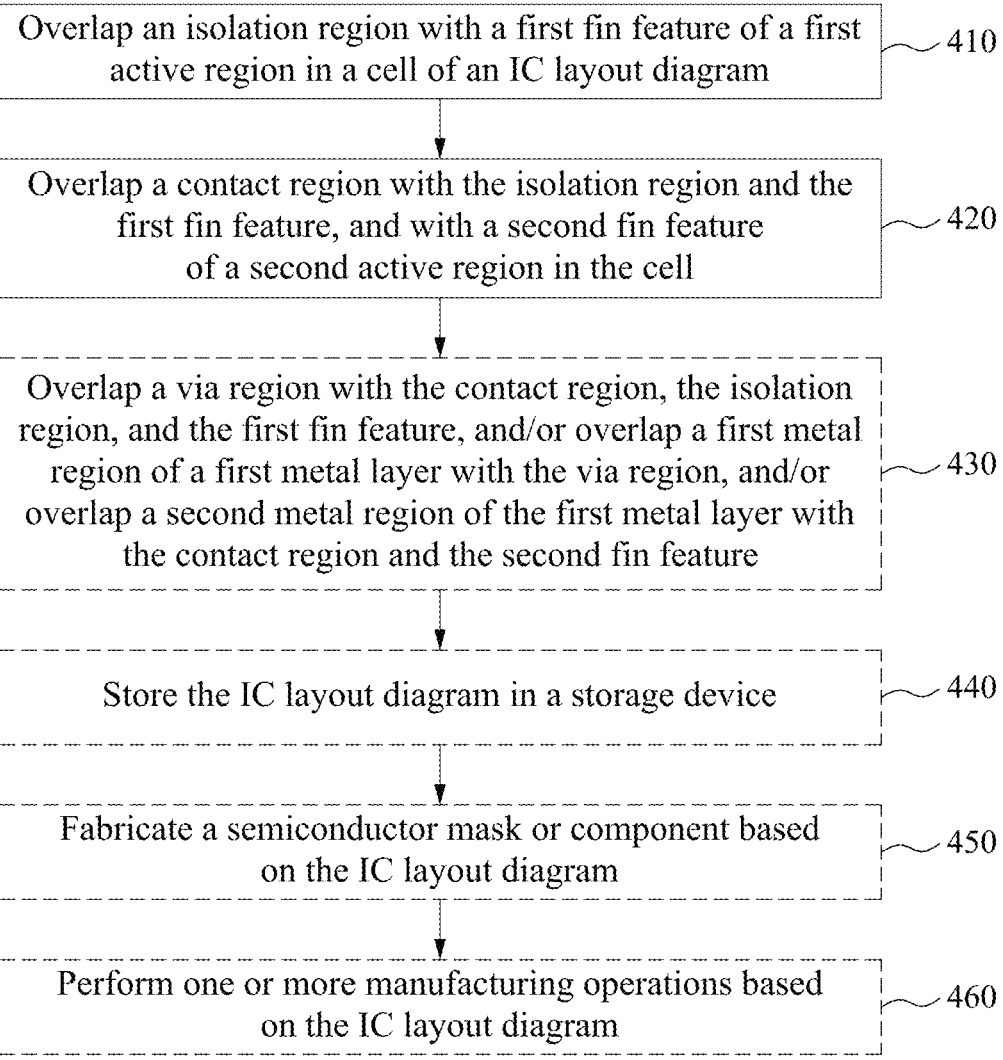
FIG. 4 is a flowchart of a method of operating an IC manufacturing system, in accordance with some embodiments.

FIG. 4 is a flowchart of a method 400 of operating an IC manufacturing system, in accordance with some embodiments. In some embodiments, operating the IC manufacturing system includes generating an IC layout diagram, e.g., IC layout diagram 500, 600A, or 600B discussed below, of an IC device including an isolated contact structure, e.g., IC device 100 including contact structure 100C discussed above with respect to FIGS. 1A-3K, manufactured based on the generated IC layout diagram. Non-limiting examples of IC devices include memory circuits, logic devices, processing devices, signal processing circuits, and the like.

In some embodiments, some or all of method 400 is executed by a processor of a computer. In some embodiments, some or all of method 400 is executed by a processor 702 of EDA system 700, discussed below with respect to FIG. 7.

In some embodiments, one or more operations of method 400 are a subset of operations of a method of forming an IC device. In some embodiments, one or more operations of method 400 are a subset of operations of an IC manufacturing flow, e.g., an IC manufacturing flow discussed below with respect to a manufacturing system 800 and FIG. 8.

In some embodiments, the operations of method 400 are performed in the order depicted in FIG. 4. In some embodiments, the operations of method 400 are performed simultaneously and/or in an order other than the order depicted in FIG. 4. In some embodiments, one or more operations are performed before, between, during, and/or after performing one or more operations of method 400.

Figure 5:
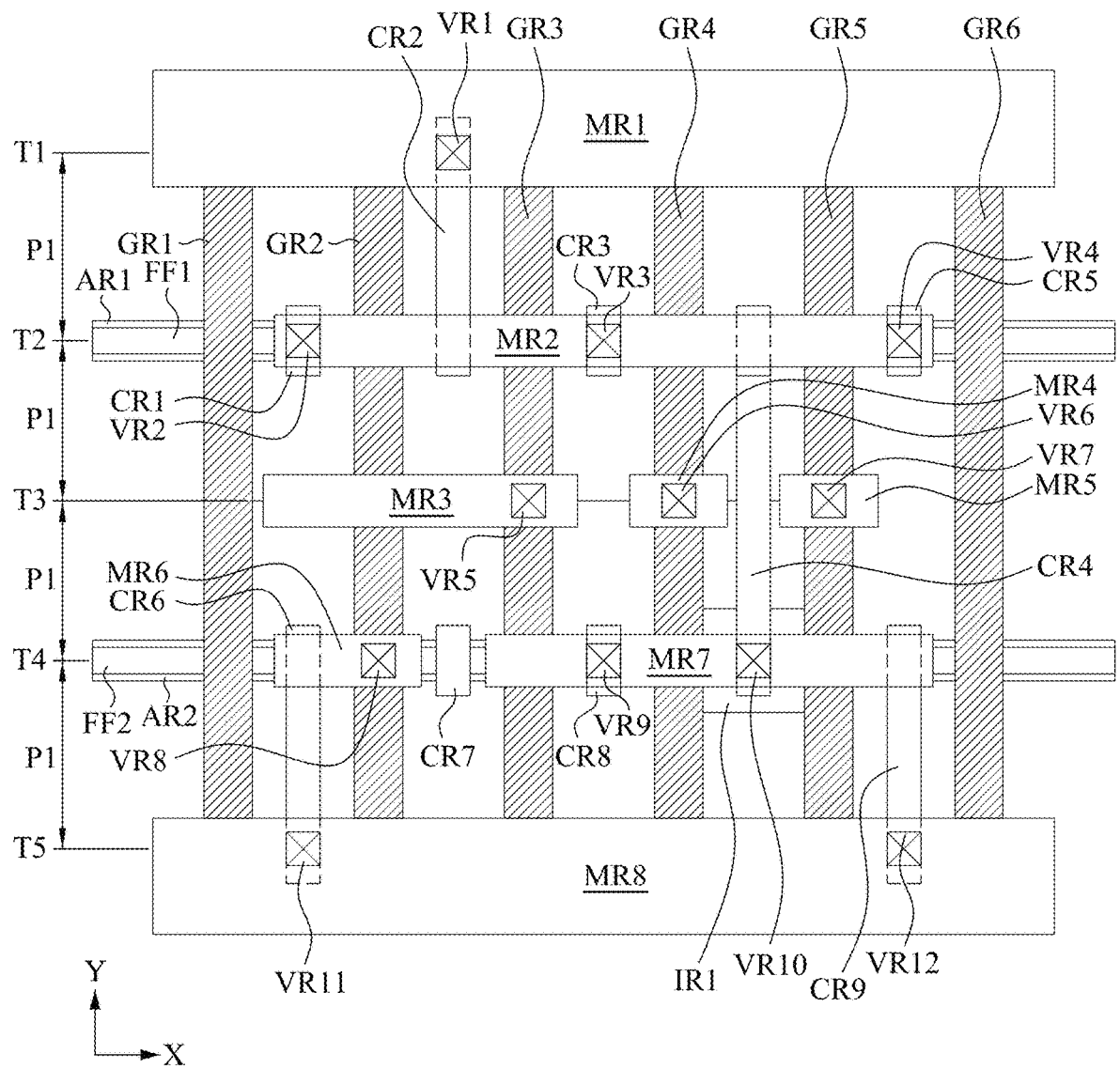
FIG. 5 depicts an IC layout diagram, in accordance with some embodiments.
Figure 6A:
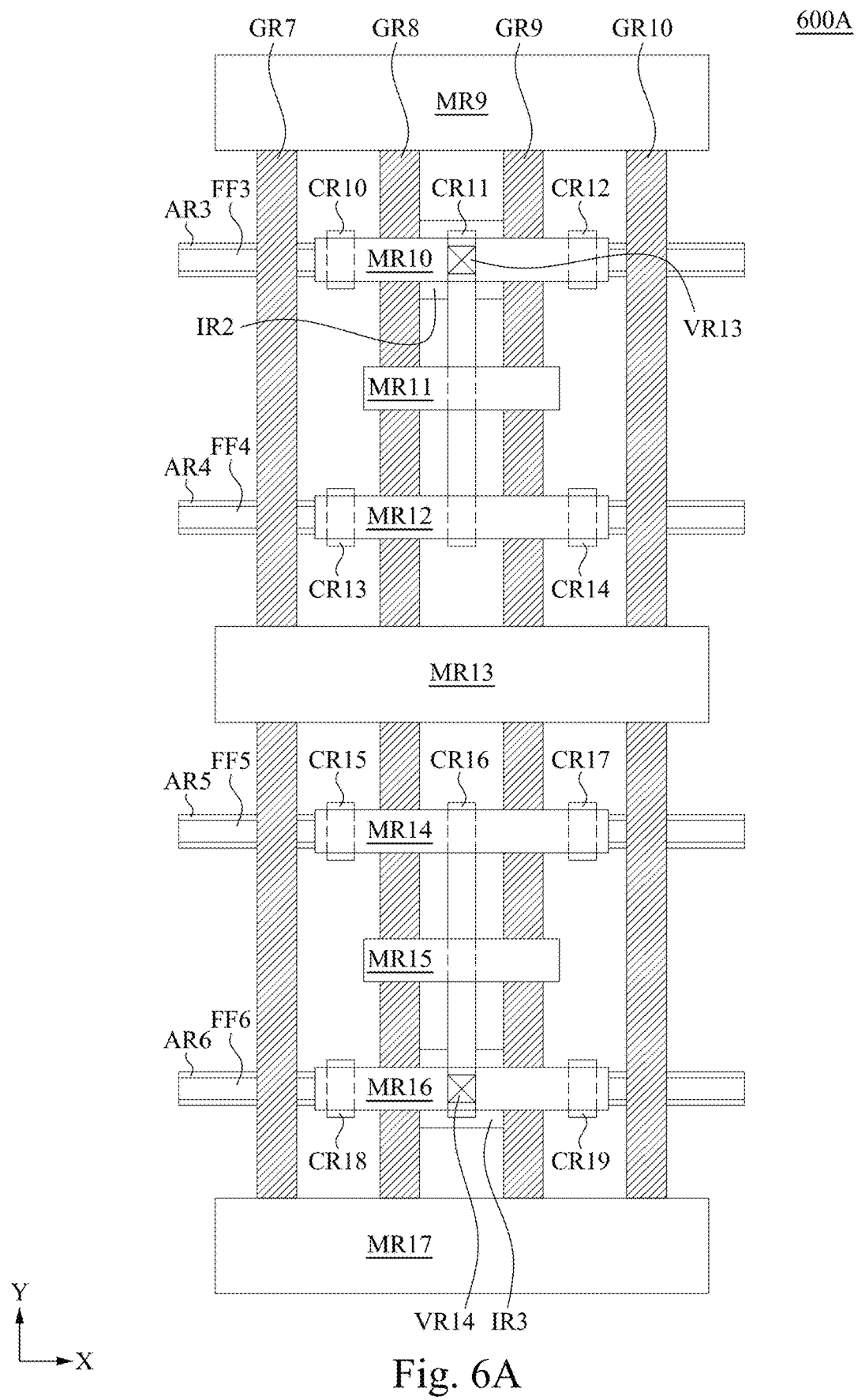
FIGS. 6A and 6B depict IC layout diagrams, in accordance with some embodiments.
Figure 6B:
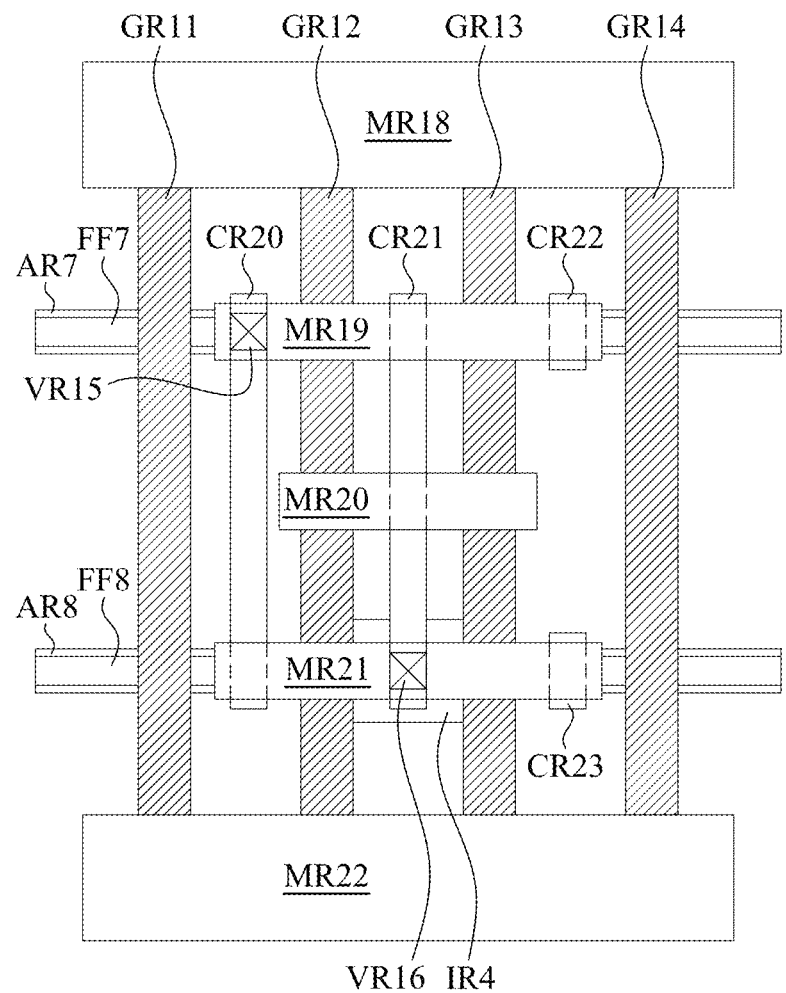

FIGS. 5-6B are depictions of non-limiting examples of corresponding IC layout diagrams 500, 600A, and 600B generated by executing one or more operations of method 400, in some embodiments. In addition to IC layout diagram 500, 600A, or 600B, each of FIGS. 5-6B includes the X and Y directions, discussed above with respect to FIGS. 1A-3K.

Each of IC layout diagrams 500, 600A, and 600B is a non-limiting example of a layout cell corresponding to a logic device that includes an isolation contact structure, e.g., contact structure 100C, discussed above with respect to FIGS. 1A-3K. IC layout diagram 500 corresponds to a logic device including a single isolation contact structure, IC layout diagram 600A corresponds to a logic device including first and second isolation contact structures, and IC layout diagram 600B corresponds to a logic device including an isolation contact structure and a bridge contact structure.

IC layout diagrams 500, 600A, and 600B are simplified for the purpose of clarity. In various embodiments, one or more of IC layout diagrams 500, 600A, or 600B includes features in addition to those depicted in FIGS. 5-6B, e.g., one or more transistor elements, power rails, isolation structures, wells, conductive elements, or the like.

As depicted in FIG. 5, IC layout diagram 500 includes an active region AR1 including a fin feature FF1, an active region AR2 including a fin feature FF2, gate regions GR1-GR6, an isolation region IR1 extending in the X direction between adjacent gate regions GR4 and GR5, contact regions CR1-CR9, via regions VR1-VR12, and metal regions MR1-MR8. Metal regions MR1-MR8 are aligned in the X direction along tracks T1-T5 having a pitch P1 in the Y direction.

As depicted in FIG. 6A, IC layout diagram 600A includes active regions AR3-AR6 including corresponding fin features FF3-FF6, gate regions GR7-GR10, isolation regions IR2 and IR3, contact regions CR10-CR19, via regions VR13 and VR14, and metal regions MR9-MR17. Each of isolation regions IR2 and IR3 extends in the X direction between adjacent gate regions GR8 and GR9.

As depicted in FIG. 6B, IC layout diagram 600B includes active regions AR7 and AR8 including corresponding fin features FF7 and FF8, gate regions GR11-GR14, an isolation region IR4 extending in the X direction between adjacent gate regions GR12 and GR13, contact regions CR20-CR23 via regions VR15 and VR16, and metal regions MR18-MR22.

An active region, e.g., one of active regions AR1-AR8, is a region in the IC layout diagram included in a manufacturing process as part of defining an active area, also referred to as an oxide diffusion or definition (OD), in a semiconductor substrate in which one or more IC device features, e.g., a source/drain region, is formed. In various embodiments, an active area is an n-type or p-type active area of a FinFET that includes at least one fin feature, e.g., a fin feature FF1-FF8, that corresponds to a fin structure in the active area defined at least in part by the active region. The fin structure includes one or more fins as discussed above with respect to fin structures FS1 and FS2 and FIGS. 1A-3K.

A gate region, e.g., one of gate regions GR1-GR14, is a region in the IC layout diagram included in the manufacturing process as part of defining a gate structure in the IC device including at least one of a conductive material or a dielectric material. In various embodiments, one or more gate structures corresponding to a gate region includes at least one conductive material overlying at least one dielectric material. In various embodiments, gate regions GR4 and GR5, GR8 and GR9, or GR12 and GR13 are included in a manufacturing process as part of defining corresponding gate structures G2 and G3 discussed above with respect to FIGS. 1-3K.

An isolation region, e.g., one of isolation regions IR1-IR4, is a region in the IC layout diagram included in the manufacturing process as part of defining one or more dielectric material layers in the IC device. In various embodiments, one of isolation regions IR1-IR4 is included in a manufacturing process as part of defining isolation layer IL1 discussed above with respect to FIGS. 1A-3K.

A contact region, e.g., a contact region CR1-CR23 is a region in the IC layout diagram included in the manufacturing process as part of defining one or more segments of one or more conductive layers in the IC device configured to form an electrical connection between one or more underlying fin structures and one or more overlying vias. In various embodiments, one of contact regions CR4, CR11, CR16, or CR21 is included in a manufacturing process as part of defining corresponding contact C2 discussed above with respect to FIGS. 1A-3K.

A via region, e.g., one of via regions VR1-VR16, is a region in the IC layout diagram included in the manufacturing process as part of defining a via including one or more segments of one or more conductive layers in the IC device configured to form an electrical connection between one or more underlying contacts or gate structures and one or more overlying metal regions. In various embodiments, one or more of via regions VR1-VR16 are included in a manufacturing process as part of defining one or more of vias V1-V8 discussed above with respect to FIGS. 1A-3K.

A metal region, e.g., one of metal regions MR1-MR22, is a region in the IC layout diagram included in the manufacturing process as part of defining one or more metal segments of a metal layer in the IC device. In various embodiments, a metal region corresponds to one or more of a metal zero layer, a metal one layer, or a higher metal layer in the IC device. In various embodiments, one or more of metal regions MR2-MR7, MR10-MR12, MR14-MR16, or MR19-MR21 are included in a manufacturing process as part of defining one or more of metal segments MS1-MS4, and/or one or more of metal regions MR1, MR8, MR9, MR13, MR17, MR18, or MR22 are included in the manufacturing process as part of defining one or both of power rails R1 or R2, each discussed above with respect to FIGS. 1A-3K.

In the embodiment depicted in FIG. 5, IC layout diagram 500 includes isolation region IR1 overlapping each of fin feature FF2 of active region AR2 and contact region CR4, and is thereby configured to define an isolation layer positioned between the fin structure defined by fin feature FF2 and the contact defined by contact region CR4. Isolation region IR1, fin feature FF2, and contact region CR4 thereby correspond to an isolation contact structure, e.g., contact structure 100C discussed above with respect to FIGS. 1A-3K, in which a contact is electrically isolated from an underlying first fin structure by an isolation layer.

IC layout diagram 500 also includes contact region CR4 overlapping each of fin feature FF1 of active region AR1 and via region VR10, and is thereby configured to define the contact overlying the fin structure defined by fin feature FF1 and underlying the via defined by via region VR10. Fin feature FF1, contact region CR4, and via region VR10 thereby correspond to the isolation contact structure in which the contact electrically connects a via overlying the first fin structure to an underlying second fin structure.

IC layout diagram 500 also includes contact regions CR1-CR3 and CR5 overlapping fin feature FF1, contact regions CR6-CR8 and CR9 overlapping fin feature FF2, via regions VR1-VR4, VR9, VR11, and VR12 overlapping corresponding contact regions CR2, CR1, CR3, CR5, CR8, CR6, and CR9, via regions VR5-VR8 overlapping corresponding gate regions GR3-GR5 and GR2, and metal regions MR1-MR8 overlapping corresponding via regions VR1-VR12 and aligned along corresponding tracks T1-T5 having pitch P1. The referenced fin features, gate regions, contact regions, via regions, and metal regions are thereby configured to define structures, including power rails corresponding to metal regions MR1 and MR8 that, combined with the isolation contact structure, form the logic device corresponding to the non-limiting example of IC layout diagram 500.

As depicted in FIG. 5, metal regions MR1-MR8 being aligned in the X direction along tracks T1-T5 having pitch P1 corresponds to a total of at most three metal regions of metal regions MR2-MR7 being aligned in the Y direction between metal regions MR1 and MR8 corresponding to power rails. Metal region MR2 overlaps fin feature FF1 and is aligned with track T2, and metal region MR7 overlaps fin feature FF2 and is aligned with track T4, separated from track T2 by twice pitch P1. In the embodiment depicted in FIG. 5, fin feature FF1 is aligned with track T2 and fin feature FF2 is aligned with track T4. In various embodiments, at least one of fin features FF1 or FF2 is not aligned with a corresponding track T2 or T4.

Although FIGS. 6A and 6B do not depict tracks, e.g., tracks T1-T5 depicted in FIG. 5, metal regions MR9-MR17 of IC layout diagram 600A and metal regions MR18-MR22 of IC layout diagram 600B have arrangements similar to that of IC layout diagram 500 such that a total of at most three metal regions are aligned in the Y direction between metal regions corresponding to power rails, as discussed below.

In the embodiment depicted in FIG. 6A, IC layout diagram 600A includes isolation region IR2 overlapping each of fin feature FF3 of active region AR3 and contact region CR11, and is thereby configured to define an isolation layer positioned between the fin structure defined by fin feature FF3 and the contact defined by contact region CR11. Isolation region IR2, fin feature FF3, and contact region CR11 thereby correspond to a first isolation contact structure, e.g., contact structure 100C discussed above with respect to FIGS. 1A-3K, in which a contact is electrically isolated from an underlying first fin structure by an isolation layer.

IC layout diagram 600A also includes contact region CR11 overlapping each of fin feature FF4 of active region AR4 and via region VR13, and is thereby configured to define the contact overlying the fin structure defined by fin feature FF4 and underlying the via defined by via region VR13. Fin feature FF4, contact region CR11, and via region VR13 thereby correspond to the first isolation contact structure in which the contact electrically connects a via overlying the first fin structure to an underlying second fin structure.

IC layout diagram 600A also includes isolation region IR3 overlapping each of fin feature FF6 of active region AR6 and contact region CR16, and is thereby configured to define an isolation layer positioned between the fin structure defined by fin feature FF6 and the contact defined by contact region CR16. Isolation region IR3, fin feature FF6, and contact region CR16 thereby correspond to a second isolation contact structure, e.g., contact structure 100C discussed above with respect to FIGS. 1A-3K, in which a contact is electrically isolated from an underlying first fin structure by an isolation layer.

IC layout diagram 600A also includes contact region CR16 overlapping each of fin feature FF5 of active region AR5 and via region VR14, and is thereby configured to define the contact overlying the fin structure defined by fin feature FF5 and underlying the via defined by via region VR14. Fin feature FF5, contact region CR16, and via region VR14 thereby correspond to the second isolation contact structure in which the contact electrically connects a via overlying the first fin structure to an underlying second fin structure.

IC layout diagram 600A also includes contact regions CR10 and CR12 overlapping fin feature FF3, contact regions CR13 and CR14 overlapping fin feature FF4, contact regions CR15 and CR17 overlapping fin feature FF5, contact regions CR18 and CR19 overlapping fin feature FF6, additional via regions (not shown) overlapping one or more of contact regions CR10, CR12-CR15, or CR17-CR19 or gate regions GR8 or GR9, and metal regions MR9-MR17 overlapping via regions VR13 and VR14 and the additional via regions. The referenced fin features, gate regions, contact regions, via regions, and metal regions are thereby configured to define structures, including power rails corresponding to metal regions MR9, MR13, and MR17 that, combined with the first and second isolation contact structures, form the logic device corresponding to the non-limiting example of IC layout diagram 600A.

In the embodiment depicted in FIG. 6B, IC layout diagram 600B includes isolation region IR4 overlapping each of fin feature FF8 of active region AR8 and contact region CR21, and is thereby configured to define an isolation layer positioned between the fin structure defined by fin feature FF8 and the contact defined by contact region CR21. Isolation region IR4, fin feature FF8, and contact region CR21 thereby correspond to an isolation contact structure, e.g., contact structure 100C discussed above with respect to FIGS. 1A-3K, in which a contact is electrically isolated from an underlying first fin structure by an isolation layer.

IC layout diagram 600B also includes contact region CR21 overlapping each of fin feature FF7 of active region AR7 and via region VR16, and is thereby configured to define the contact overlying the fin structure defined by fin feature FF7 and underlying the via defined by via region VR16. Fin feature FF7, contact region CR21, and via region VR16 thereby correspond to the isolation contact structure in which the contact electrically connects a via overlying the first fin structure to an underlying second fin structure.

IC layout diagram 600B also includes contact region CR20 overlapping each of fin features FF7 and FF8 and via region VR15, and is thereby configured to define the contact overlying each of the fin structures defined by fin features FF7 and FF8 and underlying the via defined by via region VR15. Fin features FF7 and FF8, contact region CR20, and via region VR15 thereby correspond to a bridge structure in which the contact electrically connects an overlying via to each of a first fin structure underlying the via and a second fin structure.

IC layout diagram 600B also includes contact region CR22 overlapping fin feature FF7 and contact region CR23 overlapping fin feature FF8, additional via regions (not shown) overlapping one or more of contact regions CR20-CR23 or gate regions GR12 or GR13, and metal regions MR18-MR22 overlapping via regions VR15 and VR16 and the additional via regions. The referenced fin features, gate regions, contact regions, via regions, and metal regions are thereby configured to define structures, including power rails corresponding to metal regions MR18 and MR20 that, combined with the isolation contact structure and bridge structure, form the logic device corresponding to the non-limiting example of IC layout diagram 600B.

At operation 410, in some embodiments, an isolation region is overlapped with a first fin feature of a first active region in a cell of an IC layout diagram. Overlapping the isolation region with the first fin feature of the first active region includes the isolation region being usable in a manufacturing process as part of defining one or more dielectric material layers in the IC device manufactured based on the IC layout diagram, and the first fin feature and active region being usable in the manufacturing process as part of defining a fin structure of a FinFET in the IC device such that the one or more dielectric material layers overlie the fin structure.

In various embodiments, overlapping a first region with a second region in an IC layout diagram includes modifying the IC layout diagram to include an area shared by non-entire portions of each of the first and second regions, an entirety of the first region and a non-entire portion of the second region, a non-entire portion of the first region and an entirety of the second region, or entireties of each of the first and second regions. In various embodiments, modifying the IC layout diagram includes placing one or both of the first or second regions in the IC layout diagram and/or reconfiguring one or both of the first or second regions within the IC layout diagram.

In some embodiments, overlapping the isolation region with the first fin feature of the first active region includes the isolation region being usable as part of defining isolation layer IL1 and the fin feature of the first active region being usable as part of defining fin structure FS2, each discussed above with respect to FIGS. 1A-3K.

In various embodiments, overlapping the isolation region with the first fin feature of the first active region includes overlapping isolation region IR1 with fin feature FF2 discussed above with respect to FIG. 5, overlapping one or both of isolation regions IR2 or IR3 with corresponding fin features FF3 or FF6 discussed above with respect to FIG. 6A, or overlapping isolation region IR4 with fin feature FF8 discussed above with respect to FIG. 6B.

At operation 420, a contact region is overlapped with the isolation region and the first fin feature, and with a second fin feature of a second active region in the cell. Overlapping the contact region with the isolation region, the first fin feature, and the second fin feature of the second active region includes the contact region being usable in the manufacturing process as part of defining a contact and a second fin structure in the IC device manufactured based on the IC layout diagram such that the contact overlies the one or more dielectric material layers defined by the isolation region, the first fin structure defined by the first fin feature, and the second fin structure defined by the second fin feature. Overlapping the contact region with the isolation region, the first fin feature, and the second fin feature is part of defining the contact electrically isolated from the first fin structure and electrically connected to the second fin structure.

In some embodiments, overlapping the contact region with the isolation region, the first fin feature, and the second fin feature includes the contact region being usable as part of defining contact C2, the isolation region being usable as part of defining isolation layer ILL the first fin feature being usable as part of defining fin structure FS2, and the second fin feature being usable as part of defining fin structure FS1, each discussed above with respect to FIGS. 1A-3K.

In various embodiments, overlapping the contact region with the isolation region, the first fin feature, and the second fin feature includes overlapping contact region CR4 with isolation region IR1 and corresponding fin features FF2 and FF1 discussed above with respect to FIG. 5, overlapping contact region CR11 with isolation region IR2 and corresponding fin features FF3 and FF4 and overlapping contact region CR16 with isolation region IR3 and corresponding fin features FF6 and FF5 discussed above with respect to FIG. 6A, or overlapping contact region CR21 with isolation region IR4 and corresponding fin features FF8 and FF7 discussed above with respect to FIG. 6B.

At operation 430, in some embodiments, a via region is overlapped with the contact region, the isolation region, and the first fin feature, and/or a first metal region of a first metal layer is overlapped with the via region, and/or a second metal region of the first metal layer is overlapped with the contact region and the second fin feature.

Overlapping the via region with the contact region, the isolation region, and the first fin feature includes the via region being usable in the manufacturing process as part of defining a via in the IC device manufactured based on the IC layout diagram such that the via overlies the contact defined by the contact region, the one or more dielectric material layers defined by the isolation region, and the first fin structure defined by the first fin feature. Overlapping the via region with the contact region is part of defining the via electrically connected to the contact.

In some embodiments, overlapping the via region with the contact region, the isolation region, and the first fin feature includes the via region being usable as part of defining via V7, the contact region being usable as part of defining contact C2, the isolation region being usable as part of defining isolation layer ILL and the first fin feature being usable as part of defining fin structure FS2, each discussed above with respect to FIGS. 1A-3K.

In various embodiments, overlapping the via region with the contact region, the isolation region, and the first fin feature includes overlapping via region VR10 with contact region CR4, isolation region IR1, and fin feature FF2 discussed above with respect to FIG. 5, overlapping via region VR13 with contact region CR11, isolation region IR2 and fin feature FF3 and overlapping via region VR14 with contact region CR16, isolation region IR3, and fin feature FF6 discussed above with respect to FIG. 6A, or overlapping via region VR16 with contact region CR21, isolation region IR4, and fin feature FF8 discussed above with respect to FIG. 6B.

Overlapping the first metal region of the first metal layer with the via region includes the first metal region being usable in the manufacturing process as part of defining a first metal segment in the IC device manufactured based on the IC layout diagram such that the first metal segment overlies the via defined by the via region. Overlapping the first metal region with the via region is part of defining the first metal segment electrically connected to the via.

In some embodiments, overlapping the first metal region with the via region includes the first metal region being usable as part of defining metal segment MS4 and the via region being usable as part of defining via V7, each discussed above with respect to FIGS. 1A-3K.

In various embodiments, overlapping the first metal region with the via region includes overlapping metal region MR7 with via region VR10 discussed above with respect to FIG. 5, overlapping metal region MR10 with via region VR13 and/or overlapping metal region MR16 with via region VR14 discussed above with respect to FIG. 6A, or overlapping metal region MR21 with via region VR16 discussed above with respect to FIG. 6B.

Overlapping the second metal region of the first metal layer with the contact region and the second fin feature includes the second metal region being usable in the manufacturing process as part of defining a second metal segment in the IC device manufactured based on the IC layout diagram such that the second metal segment overlies the contact defined by the contact region and the fin structure defined by the second fin feature. Overlapping the second metal region with the contact region and the second fin feature is part of defining the second metal segment electrically isolated from the contact.

In some embodiments, overlapping the second metal region with the contact region and the second fin feature includes the second metal region being usable as part of defining metal segment MS4, the contact region being usable to define contact C2, and the second fin feature being usable as part of defining fin structure FS1, each discussed above with respect to FIGS. 1A-3K.

In various embodiments, overlapping the second metal region with the contact region and the second fin feature includes overlapping metal region MR2 with contact region CR4 and fin feature FF1 discussed above with respect to FIG. 5, overlapping metal region MR12 with contact region CR11 and fin feature FF4 and/or overlapping metal region MR14 with contact region CR16 and fin feature FF5 discussed above with respect to FIG. 6A, or overlapping metal region MR19 with contact region CR21 and fin feature FF7 discussed above with respect to FIG. 6B.

In some embodiments, overlapping the first metal region includes aligning the first metal region along a first track of a plurality of tracks, overlapping the second metal region includes aligning the second metal region along a second track of the plurality of tracks, the first and second tracks having a spacing equal to twice a pitch of the plurality of tracks. Aligning the first and second metal regions along the first and second tracks corresponds to a total of at most three metal regions being aligned along the direction of the pitch and between metal segments corresponding to power rails in the IC device manufactured based on the IC layout diagram.

In some embodiments, aligning the first and second metal regions along the first and second tracks includes aligning metal region MR7 along track T4 and metal region MR2 along track T2 discussed above with respect to FIG. 5.

At operation 440, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 450, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 460, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 400, an IC layout diagram, e.g., IC layout diagram 500, 600A, or 600B, is generated including at least one isolation region configured to form an isolation layer between a fin structure and an overlying contact of an IC device manufactured based on the IC layout diagram. Compared to methods that do not include configuring an isolation region to form the isolation layer, method 400 is usable to generate IC layout diagrams and devices having improved routing flexibility as discussed above with respect to IC device 100 and contact structure 100C, thereby supporting IC layouts and devices in which a separation between adjacent power rails corresponds to a total of three metal regions corresponding to signal traces.

Figure 7:
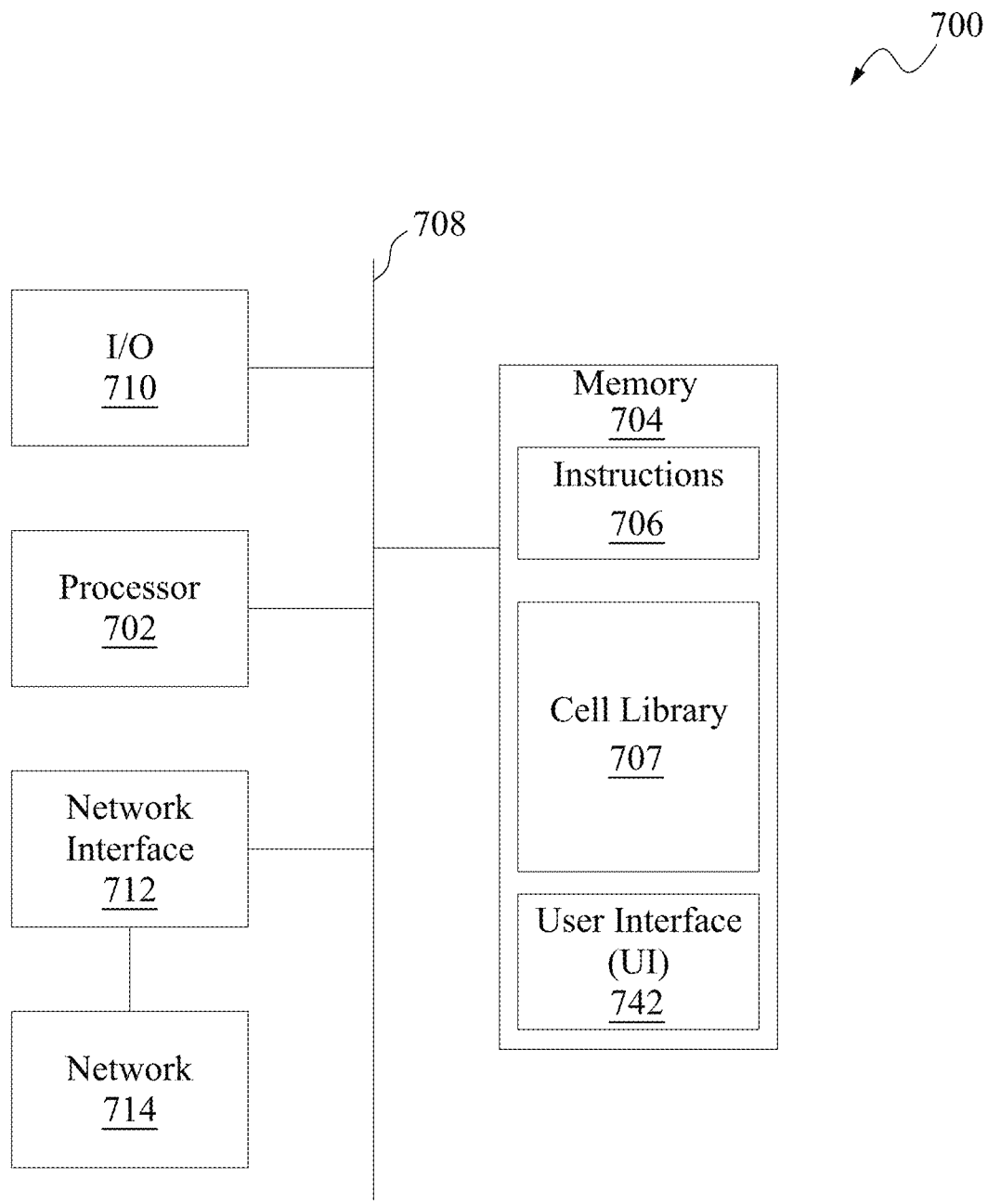
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein of designing layout diagrams representing wire routing arrangements, in accordance with one or more embodiments, are implementable, for example, using EDA system 700, in accordance with some embodiments.

In some embodiments, EDA system 700 is a general purpose computing device including a processor 702 and a non-transitory, computer-readable storage medium 704, also referred to as a memory 704 in some embodiments. Computer-readable storage medium 704, amongst other things, is encoded with, i.e., stores, computer program code 706, i.e., a set of executable instructions also referred to as instructions 706 in some embodiments. Execution of computer program code 706 by processor 702 represents (at least in part) an EDA tool which implements a portion or all of a method according to an embodiment, e.g., method 400 described above with respect to FIG. 4 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores library 707 of standard cells including IC layout diagrams as disclosed herein, e.g., IC layout diagrams 500, 600A, and/or 600B discussed above with respect to FIGS. 5-6B.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
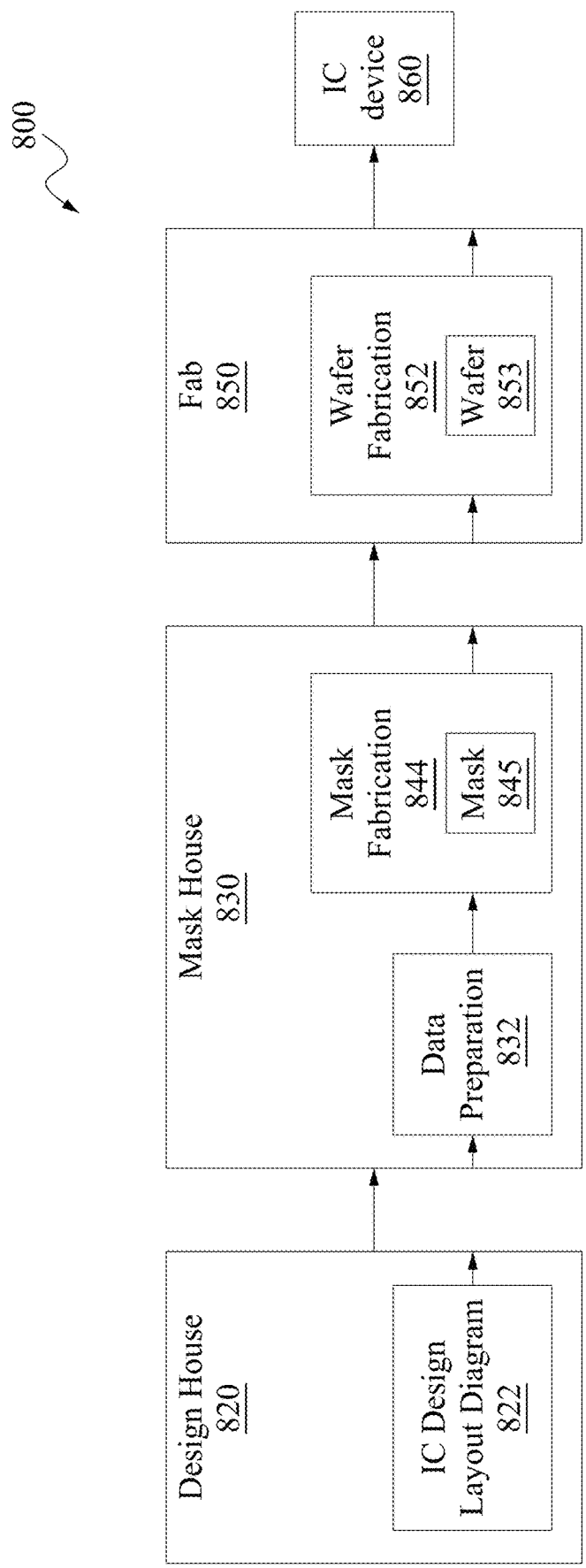
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram 500, 600A, or 600B discussed above with respect to FIGS. 5-6B, designed for an IC device 860, e.g., IC device 100, discussed above with respect to FIGS. 1A-3K. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8 mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC structure includes a fin structure, a contact overlying the fin structure along a first direction, and an isolation layer between the contact and the fin structure. The isolation layer is adjacent to a portion of the contact along a second direction perpendicular to the first direction.

In some embodiments, a method of manufacturing an IC structure includes forming an opening in a first dielectric material between a first gate structure and a second gate structure by removing a portion of the first dielectric material overlying a fin structure, filling at least part of the opening with a second dielectric material, and forming a contact overlying the fin structure and the second dielectric material.

In some embodiments, a method of operating an IC manufacturing system includes overlapping an isolation region with a first fin feature of a first active region in a cell of an IC layout diagram, the isolation region extending between adjacent first and second gate regions, and overlapping a contact region with the isolation region and the first fin feature, and with a second fin feature of a second active region in the cell. At least one of overlapping the isolation region or overlapping the contact region is executed by a processor of a computer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure comprising:
a fin structure that extends along a substrate in a first direction;
a first gate structure that overlies the fin structure and extends in a second direction perpendicular to the first direction;
a second gate structure that overlies the fin structure and extends in the second direction;
a contact that extends in the second direction between the first and second gate structures and parallel to the substrate above the fin structure;
a via overlying and electrically connected to the contact; and
an isolation layer stacked directly on the fin structure and below the contact that is stacked directly on the isolation layer and configured to electrically isolate the contact from the fin structure,
wherein
each of the first gate structure, the second gate structure, and the contact extends a same distance above the substrate in a third direction perpendicular to each of the first direction and the second direction,
the contact comprises a first portion aligned with the via, the isolation layer, and the fin structure in the third direction and a second portion adjacent to the first portion in the second direction,
the second portion includes a volume aligned with the isolation layer in the second direction and contacting the isolation layer along a plane perpendicular to the second direction,
the first and second portions have respective first and second thicknesses in the third direction, and
the second thickness is greater than the first thickness.

2. The IC structure of claim 1, wherein
the fin structure is a first fin structure,
the IC structure further comprises a second fin structure, and
the second portion of the contact overlies and is electrically connected to the second fin structure.

3. The IC structure of claim 2, wherein
the first fin structure comprises a first type of semiconductor material, and
the second fin structure comprises a second type of semiconductor material different from the first type.

4. The IC structure of claim 1, further comprising:
a first metal segment overlying and electrically connected to the via;
a second metal segment overlying the contact and another fin structure underlying the second portion of the contact; and
an inter-level dielectric (ILD) layer between the second metal segment and the second portion of the contact,
wherein the first metal segment and the second metal segment are part of a same metal layer.

5. The IC structure of claim 4, wherein
the first metal segment and the second metal segment are positioned between a first power rail and a second power rail in the same metal layer,
the first metal segment and the second metal segment have approximately a same width w,
a separation between the first metal segment and the first power rail and a separation between the second metal segment and the second power rail have approximately a same distance d1, and
a separation between the first power rail and the second power rail is approximately equal to 3w+4d1.

6. The IC structure of claim 1, wherein
each of the contact and the isolation layer contacts an inter-level dielectric (ILD) structure, and
the isolation layer and the ILD structure comprise different dielectric materials.

7. The IC structure of claim 1, wherein the isolation layer extends from the first gate structure to the second gate structure.

8. The IC structure of claim 1, wherein
the another fin structure is electrically connected to the second portion of the contact,
the via is a first via,
the IC structure further comprises second and third vias, each electrically connected to the another fin structure and the second metal segments, and
the first and second gate structures are located between the second and third vias.

9. An integrated circuit (IC) structure comprising:
a first dielectric material;
a first gate structure that extends along the first dielectric material in a first direction;
a second gate structure separated from the first gate structure in a second direction by the first dielectric material, the second gate structure extending in the first direction;
a fin structure that extends along the first dielectric material in the second direction and underlies each of the first gate structure and the second gate structure;
a second dielectric material located, at least in part, stacked directly on the fin structure; and
a contact located over the fin structure and, in part, stacked directly on the second dielectric material, wherein the second dielectric material is configured to electrically isolate the contact from the fin structure; and
a first via stacked directly on the contact and located over the fin structure,
wherein
the contact is located between the first and second gate structures and includes a first thickness adjacent to the second dielectric material and a second thickness between the first via and the second dielectric material,
the first thickness includes a volume of the contact aligned with the second dielectric material in the first direction and contacting the second dielectric material along a plane perpendicular to the first direction,
the second thickness is smaller than the first thickness, and
each of the first gate structure, the second gate structure, and the contact extends a same distance above the first dielectric material in a third direction perpendicular to each of the first direction and the second direction.

10. The IC structure of claim 9, wherein the second dielectric material extends from the first gate structure to the second gate structure.

11. The IC structure of claim 9, wherein
the fin structure is a first fin structure, and
the IC structure further comprises a second fin structure.

12. The IC structure of claim 9, wherein the second dielectric material has a target thickness between the fin structure and the contact.

13. The IC structure of claim 9, further comprising:
a first metal segment electrically connected to the first via; and a second metal segment located on the first dielectric material and overlying the contact and another fin structure underlying the contact.

14. The IC structure of claim 9, further comprising:
a second via stacked directly on the fin structure; and
a metal segment stacked directly on each of the first and second vias,
wherein the first gate structure is located between the first and second vias.

15. The IC structure of claim 14, further comprising:
a second contact stacked directly on the fin structure, wherein the second gate structure is located between the first and second contacts;
a third via stacked directly on the second contact; and
a power rail stacked directly on the third via.

16. An integrated circuit (IC) structure comprising:
a first dielectric;
a first fin structure that extends in a first direction and overlaps the first dielectric;
a first gate structure that overlies the first fin structure and extends in a second direction perpendicular to the first direction;
a second gate structure that overlies the first fin structure and extends in the second direction, wherein the first dielectric extends between the first and the second gate structures;
a contact that extends in the second direction between the first and second gate structures and overlaps with the first dielectric and the first fin structure, and with a second fin structure; and
an isolation layer that is stacked, at least partially, below the contact and is stacked directly over the first fin structure, the isolation layer configured to electrically isolate the contact from the first fin structure; and
a via stacked directly on the contact above the isolation layer and the first fin structure,
wherein
the contact has a first thickness that is reduced to a second thickness at a portion of the contact between the first fin structure and the via,
the first thickness includes a volume of the contact aligned with the isolation layer in the second direction and contacting the isolation layer along a plane perpendicular to the second direction, and
each of the first gate structure, the second gate structure, and the contact extends a same distance above the first dielectric in a third direction perpendicular to each of the first direction and the second direction.

17. The IC structure of claim 16, further comprising:
a first metal segment that overlaps the via; and
a second metal segment that overlaps the contact and the second fin structure.

18. The IC structure of claim 16, wherein
each of the contact and the isolation layer contacts an inter-level dielectric (ILD) structure, and
the isolation layer and the ILD structure comprise different dielectric materials.

19. The IC structure of claim 16, wherein
the isolation layer is adjacent to a portion of the contact along the second direction perpendicular to the first fin structure along the first direction.

20. The IC structure of claim 16, wherein the first and second fin structures comprise opposite types of semiconductor material.

* * * * *